US009582768B1

(12) United States Patent
Englehart et al.

(10) Patent No.: US 9,582,768 B1
(45) Date of Patent: Feb. 28, 2017

(54) DETERMINING CONDITIONS ASSOCIATED WITH ACCESSING DATA STORES

(71) Applicant: The MathWorks, Inc., Natick, MA (US)

(72) Inventors: Matthew J. Englehart, Olmsted Township, OH (US); Zhi Han, Acton, MA (US); Pieter J. Mosterman, Framingham, MA (US)

(73) Assignee: The MathWorks, Inc., Natick, MA (US)

(*) Notice: Subject to any disclaimer, the term of this patent is extended or adjusted under 35 U.S.C. 154(b) by 475 days.

(21) Appl. No.: 13/826,812

(22) Filed: Mar. 14, 2013

Related U.S. Application Data

(63) Continuation-in-part of application No. 13/632,509, filed on Oct. 1, 2012, now Pat. No. 8,762,311, which
(Continued)

(51) Int. Cl.
G06F 17/00 (2006.01)
G06F 17/20 (2006.01)
G06N 99/00 (2010.01)

(52) U.S. Cl.
CPC ..... *G06N 99/005* (2013.01); *G06F 2205/123* (2013.01)

(58) Field of Classification Search
CPC ................ G06F 12/08; G06F 12/0893; G06F 2212/251; G06F 2212/253; G06F 12/0862; G06F 2205/104; G06F 5/10; G06F 12/0811; G06F 13/385; G06F 17/30516; G06F 17/30539; G06F 17/30551; G06F 19/322; G06F 19/3418; G06F 19/3443; G06F 19/345; G06F 2212/6024; G06F 2212/6026; G06F 2216/03; G06F 9/38
See application file for complete search history.

(56) References Cited

U.S. PATENT DOCUMENTS 5,283,896 A 2/1994 Temmyo et al.
6,457,173 B1 9/2002 Gupta et al.
(Continued)

OTHER PUBLICATIONS

Mathworks, "Simulink—Dynamic System Simulation for MATLAB", Jan. 1999, Version 3, pp. 1-605.*
(Continued)

*Primary Examiner* — Stanley K Hill
*Assistant Examiner* — Paulinho E Smith
(74) *Attorney, Agent, or Firm* — Harrity & Harrity, LLP

(57) ABSTRACT

A device may receive, from a user, a selection of one of a graphical representation of a data store included in a model or a string of text that identifies a variable associated with the model. The device may provide, based on the selection, a user interface for providing pattern information associated with the data store. The device may receive, via the user interface, the pattern information associated with the data store. The pattern information may identify one or more elements included in the model and a pattern associated with the one or more elements accessing the data store during an execution of the model. The device may analyze the model based on the pattern information and may output a result. The result may indicate whether the model accesses the data store in compliance with the pattern.

21 Claims, 21 Drawing Sheets

Related U.S. Application Data is a continuation of application No. 12/404,118, filed on Mar. 13, 2009, now Pat. No. 8,280,832, which is a continuation-in-part of application No. 12/404,085, filed on Mar. 13, 2009, now Pat. No. 8,601,457, which is a continuation-in-part of application No. 12/171,082, filed on Jul. 10, 2008, now Pat. No. 8,234,647.

(60) Provisional application No. 61/157,470, filed on Mar. 4, 2009, provisional application No. 61/157,480, filed on Mar. 4, 2009, provisional application No. 61/063,293, filed on Jan. 31, 2008.

(56) References Cited

U.S. PATENT DOCUMENTS

| | | | |
|---|---|---|---|
| 6,470,486 B1 | 10/2002 | Knapp | |
| 6,857,082 B1 | 2/2005 | Josan et al. | |
| 7,079,051 B2* | 7/2006 | Storer et al. | 341/51 |
| 7,149,959 B1* | 12/2006 | Jones et al. | 715/234 |
| 7,555,418 B1 | 6/2009 | Qadeer et al. | |
| 8,234,647 B1* | 7/2012 | Chutinan et al. | 718/102 |
| 8,280,832 B1* | 10/2012 | Englehart et al. | 706/45 |
| 8,601,457 B1* | 12/2013 | Han | 717/156 |
| 2002/0004810 A1 | 1/2002 | Reneris | |
| 2002/0095434 A1* | 7/2002 | Lane | 707/201 |
| 2004/0078618 A1* | 4/2004 | Moser et al. | 714/3 |
| 2004/0181543 A1* | 9/2004 | Wu et al. | 707/102 |
| 2005/0060647 A1 | 3/2005 | Doan et al. | |
| 2005/0125789 A1 | 6/2005 | Dijkstra et al. | |
| 2005/0219075 A1* | 10/2005 | Storer et al. | 341/51 |
| 2007/0157162 A1* | 7/2007 | Ciolfi | 717/105 |
| 2009/0144545 A1* | 6/2009 | Dhuvur et al. | 713/165 |

OTHER PUBLICATIONS

Reactive Systems, "Chapter 14 Preparing Models for Use with Reactis", Dec. 11, 2007, pp. 1-11 (website URL: http://www.reactive-systems.com/reactis/doc/user/user014.html).*

STINFO, "System on a Chip Real-Time Emulation (SOCRE)", Sep. 2006, pp. 1-17.*

Co-pending U.S. Appl. No. 13/632,509 entitled "Proving Latency Associated with References to a Data Store", by Englehart et al., filed Oct. 1, 2012, 74 pages.

Co-pending U.S. Appl. No. 12/404,085 entitled "Checking for Access Problems with Data Stores", by Han, filed Mar. 13, 2009, 75 pages.

Xie et al., Allocation and Scheduling of Conditional Task Graph in Hardware/Software Co-Synthesis, Proceedings of the Conference on Design, Automation and Test in Europe, Mar. 2001, pp. 620-625.

* cited by examiner

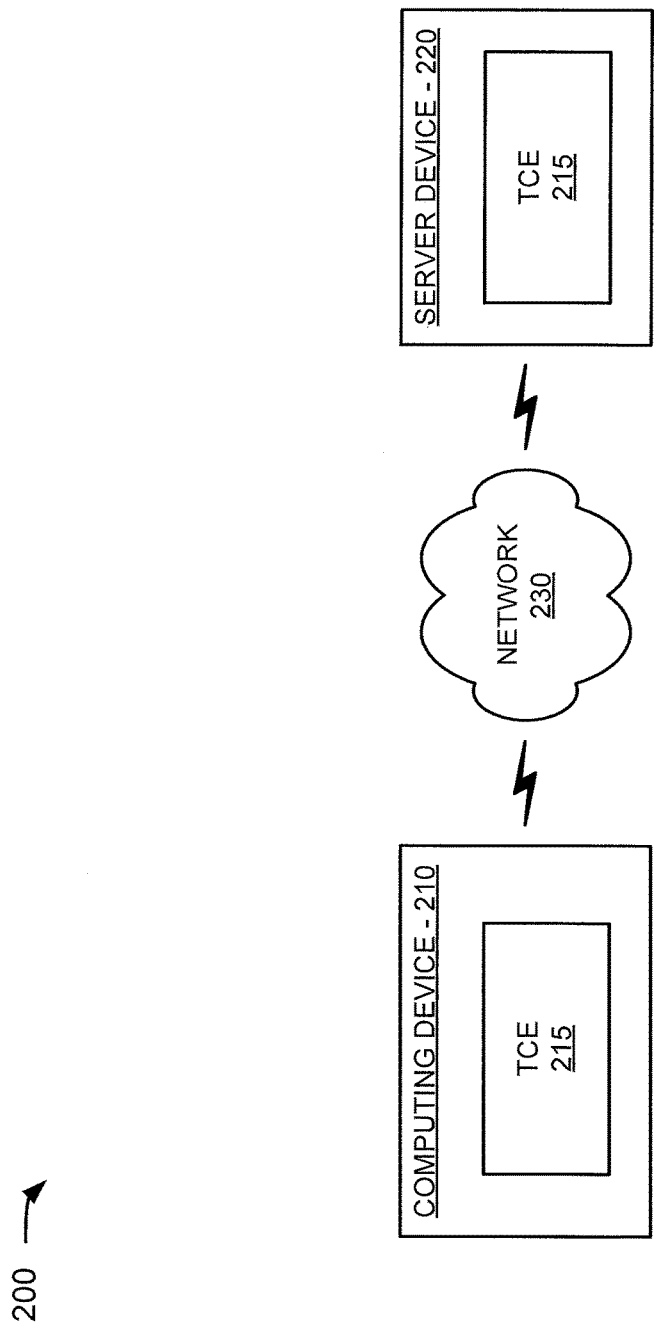

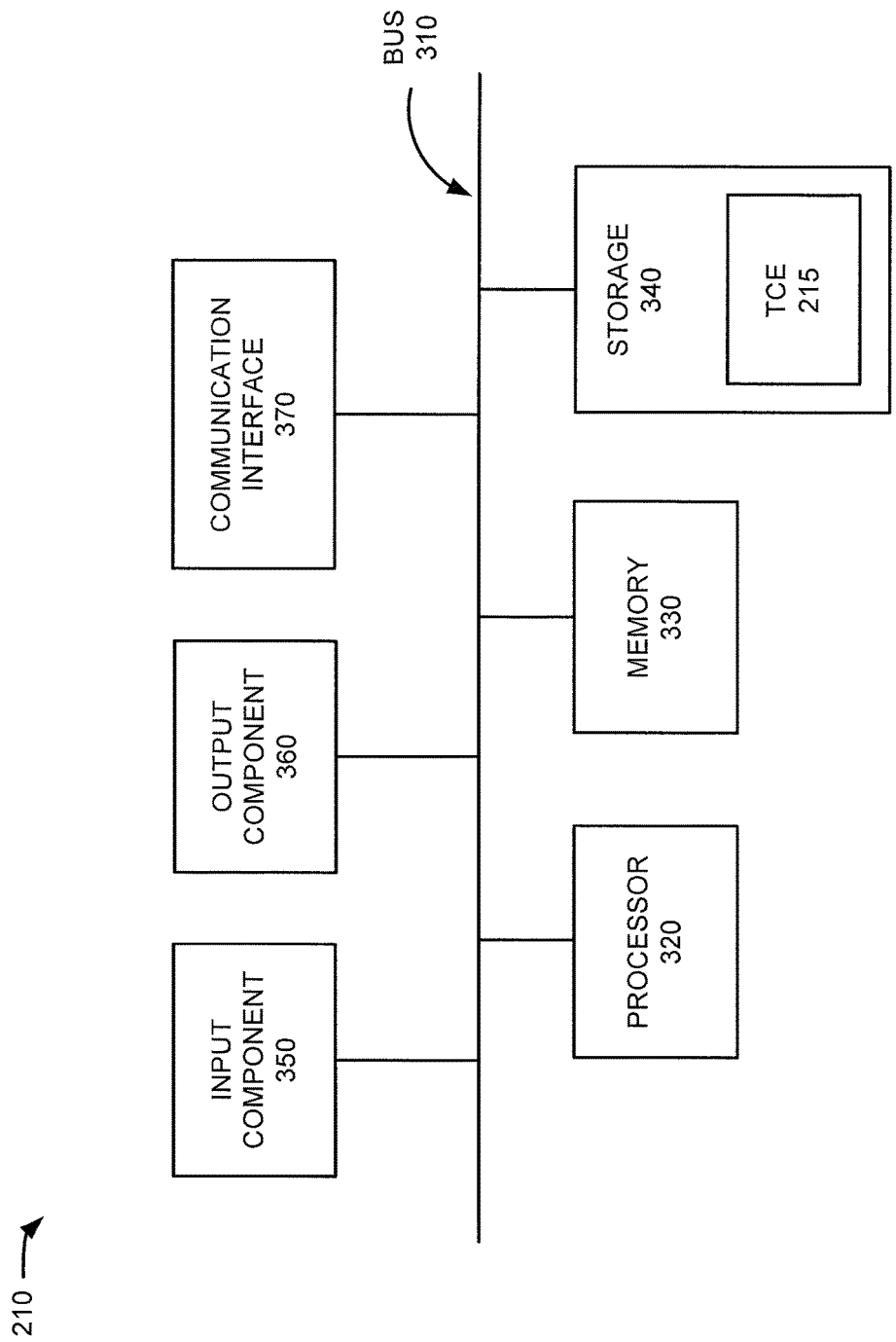

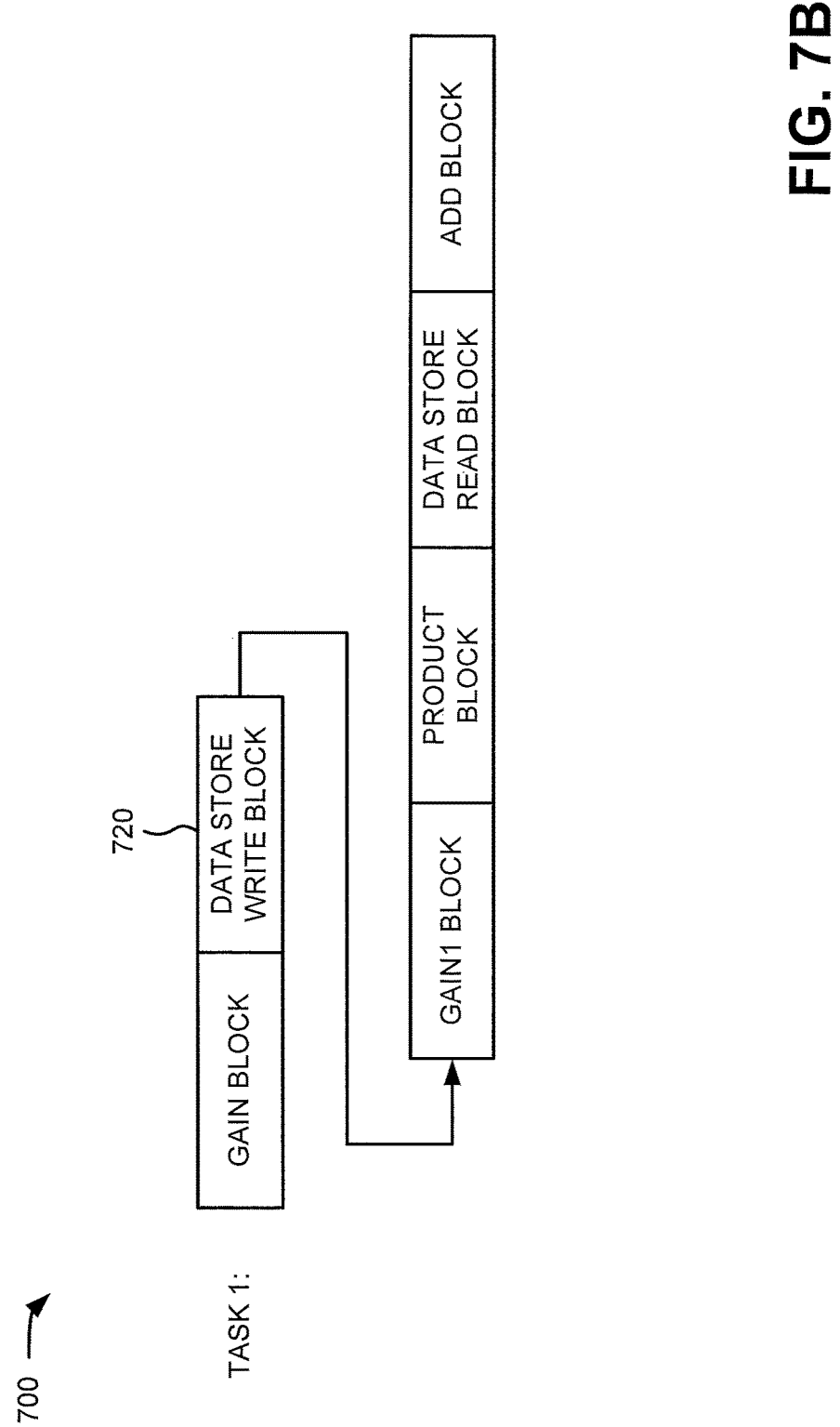

DETERMINING CONDITIONS ASSOCIATED WITH ACCESSING DATA STORES

RELATED APPLICATIONS

The present application is a continuation-in-part of U.S. patent application Ser. No. 13/632,509, filed Oct. 1, 2012, which is a continuation of U.S. patent application Ser. No. 12/404,118, filed Mar. 13, 2009, now U.S. Pat. No. 8,280,832, which claims the benefit of U.S. Provisional Application No. 61/157,470, filed Mar. 4, 2009, the disclosures of which are incorporated herein by reference.

In addition, the present application is a continuation-in-part of U.S. patent application Ser. No. 12/404,085, filed Mar. 13, 2009, which claims the benefit of U.S. Provisional Application No. 61/157,480, filed on Mar. 4, 2009, the disclosures of which are incorporated herein by reference. Further, U.S. patent application Ser. No. 12/404,085 is a continuation-in-part of U.S. patent application Ser. No. 12/171,082, filed Jul. 10, 2008, now U.S. Pat. No. 8,234,647, which claims the benefit of U.S. Provisional Application No. 61/063,293, filed on Jan. 31, 2008, the disclosures of which are incorporated herein by reference.

BRIEF DESCRIPTION OF THE DRAWINGS

The accompanying drawings, which are incorporated in and constitute a part of this specification, illustrate one or more implementations and, together with the description, explain these implementations. In the drawings:

FIG. 2 is a diagram of an example environment in which systems and/or methods, described herein, may be implemented;

FIG. 3 is a diagram of example components of the computing device of FIG. 2;

FIGS. 7A-7I are diagrams of an example of the process described in connection with FIG. 6.

DETAILED DESCRIPTION

Figure 1A:
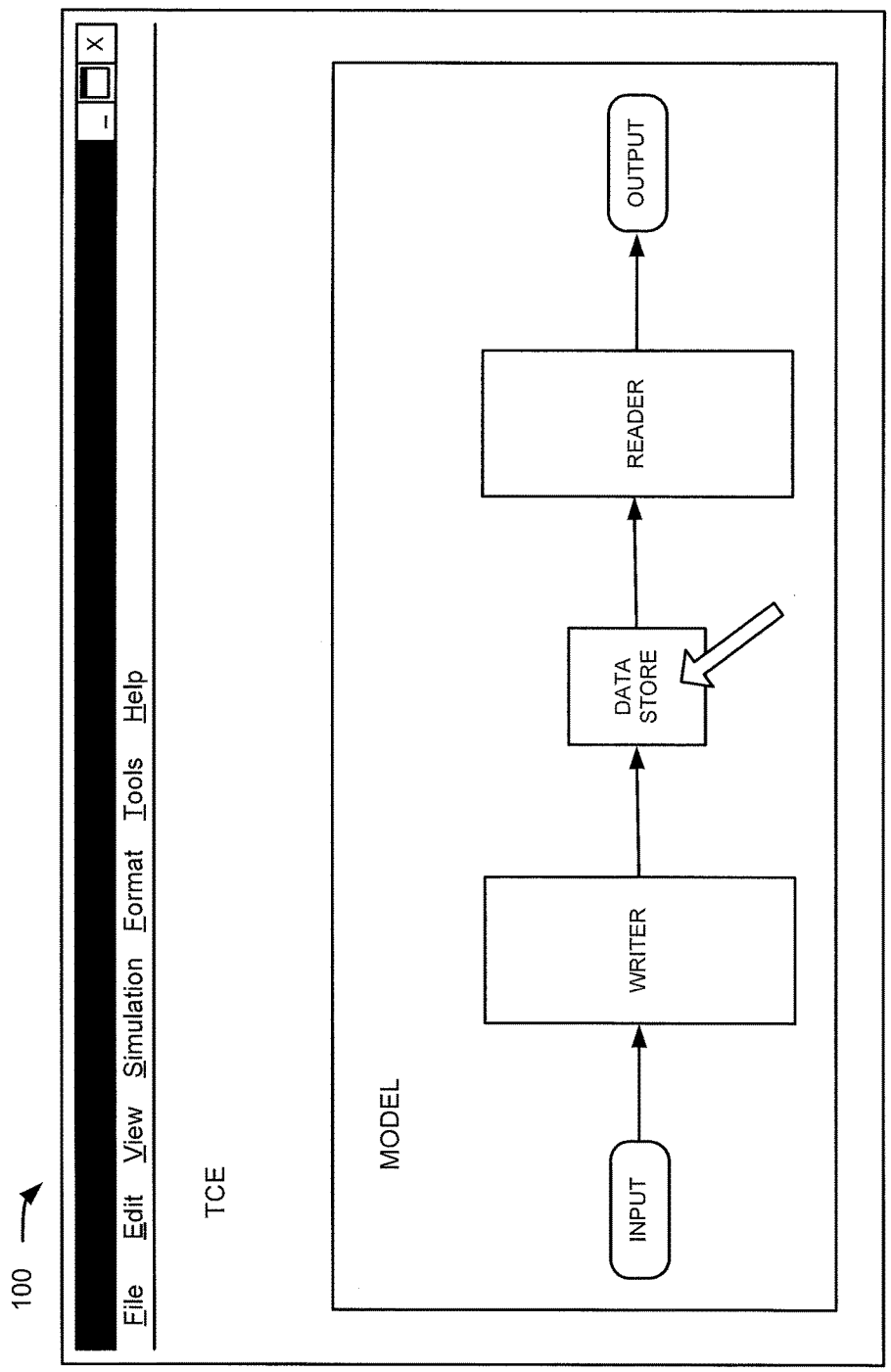
FIGS. 1A-1C are diagrams of an example overview of an implementation described herein.

The following detailed description refers to the accompanying drawings. The same reference numbers in different drawings may identify the same or similar elements.

A model may include a set of model elements that, when executed on a computing device, simulates behavior of a system. The system may correspond to a dynamic system (e.g., an airplane wing/aileron system); a natural system (e.g., human organ, a plant, etc.), a physical system (e.g., a bouncing ball, etc.), etc. The system may include a set of physical elements that correspond to portions and/or components of the system. The model elements may correspond to the physical elements and may, when executed, simulate the behavior of the physical elements and/or the system.

Systems and/or methods, as described herein, may use a computing environment, such as a technical computing environment (TCE), for performing computing operations. A TCE may include any hardware-based logic or a combination of hardware and software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, Simscape™ software, etc., by The MathWorks, Incorporated; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models of systems and/or processes. The TCE may include additional tools, such as tools designed to convert a model into an alternate representation, such as source computer code, compiled computer code, or a hardware description (e.g., a description of a circuit layout).

Models generated with the TCE may be, for example, models of a physical system, a computing system, an engineered system, an embedded system, a biological system, a chemical system, etc. The models may be based on differential equations, partial differential equations, difference equations, differential and algebraic equations, discrete-event systems, state transition systems, state charts, data-flow systems, etc. In some implementations, models may be hierarchical, and include a number of hierarchical levels. A hierarchical level, of a hierarchical model, may be represented by an entity, such as a subsystem or a subchart. The subsystem or subchart may be associated with a local namespace, where data may be globally accessible within the namespace, but not outside the namespace.

A model generated with the TCE may include, for example, any equations, action language, assignments, constraints, computations, algorithms, functions, methods, and/or process flows. The model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), noncausal block diagrams (e.g., via the Simscape™ product, available from The MathWorks, Incorporated), and/or any other type of model.

The values of attributes of a model generated with the TCE may be set to characteristics settings, such as one or more default settings, one or more inherited settings, etc. For example, the data type of a variable that is associated with a block may be set to a default data type, such as a double. Because of the default setting, an alternate data type (e.g., a single, an integer, a fixed point, etc.) may be inferred based on attributes of elements that the model includes (e.g., the data type of a variable associated with a connected block) and/or attributes of the graphical model. As another example, the causality of an equation (i.e., which variable in the equation is computed by using that equation) associated with a block may be inferred based on attributes of elements that the model includes (e.g., the fixed causality of source elements in the model, the preferred causality of integration over time, etc.).

As yet another example, the sample time associated with a model element (e.g., a block, a port, a signal, etc.) may be set to be inherited. In case of an inherited sample time, a specific sample time may be inferred based on attributes of elements that the graphical model includes and/or attributes of the graphical model (e.g., a fundamental execution period). This inference may be performed by propagation of model element attributes. For example, after evaluating the sample time attribute of a first block, a graph search may proceed by evaluating the sample time attribute of a second block that is directly connected to the first block. The evaluating of the sample time attribute of the second block may account for the sample time attribute value of the first block (e.g., by adopting the value of the sample time attribute of the first block). Other attributes may also be inferred, such as data type attributes, dimension attributes and complexity attributes (e.g., whether a variable has an imaginary part).

As previously mentioned, an example embodiment of the TCE may use one or more text-based products, such as textual modeling environments. For example, a text-based modeling environment, may be implemented using products such as, but not limited to, MATLAB by The MathWorks, Incorporated; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware or a combination of hardware and software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on entire aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, computer aided design (CAD), product life cycle management (PLM), life sciences, education, discrete event analysis and/or design, state based analysis and/or design, etc.

In some implementations, the TCE may be implemented in a graphically-based modeling environment using products such as, but not limited to, Simulink®, Stateflow®, SimEvents®, Simscape™, etc., by The MathWorks, Incorporated; VisSim by Visual Solutions; LabView® by National Instruments; Dymola by Dassault Systèmes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment. In some implementations, the TCE may be implemented in a hybrid environment that includes elements of a text-based modeling environment and elements of a graphically-based modeling environment.

Figure 1B:
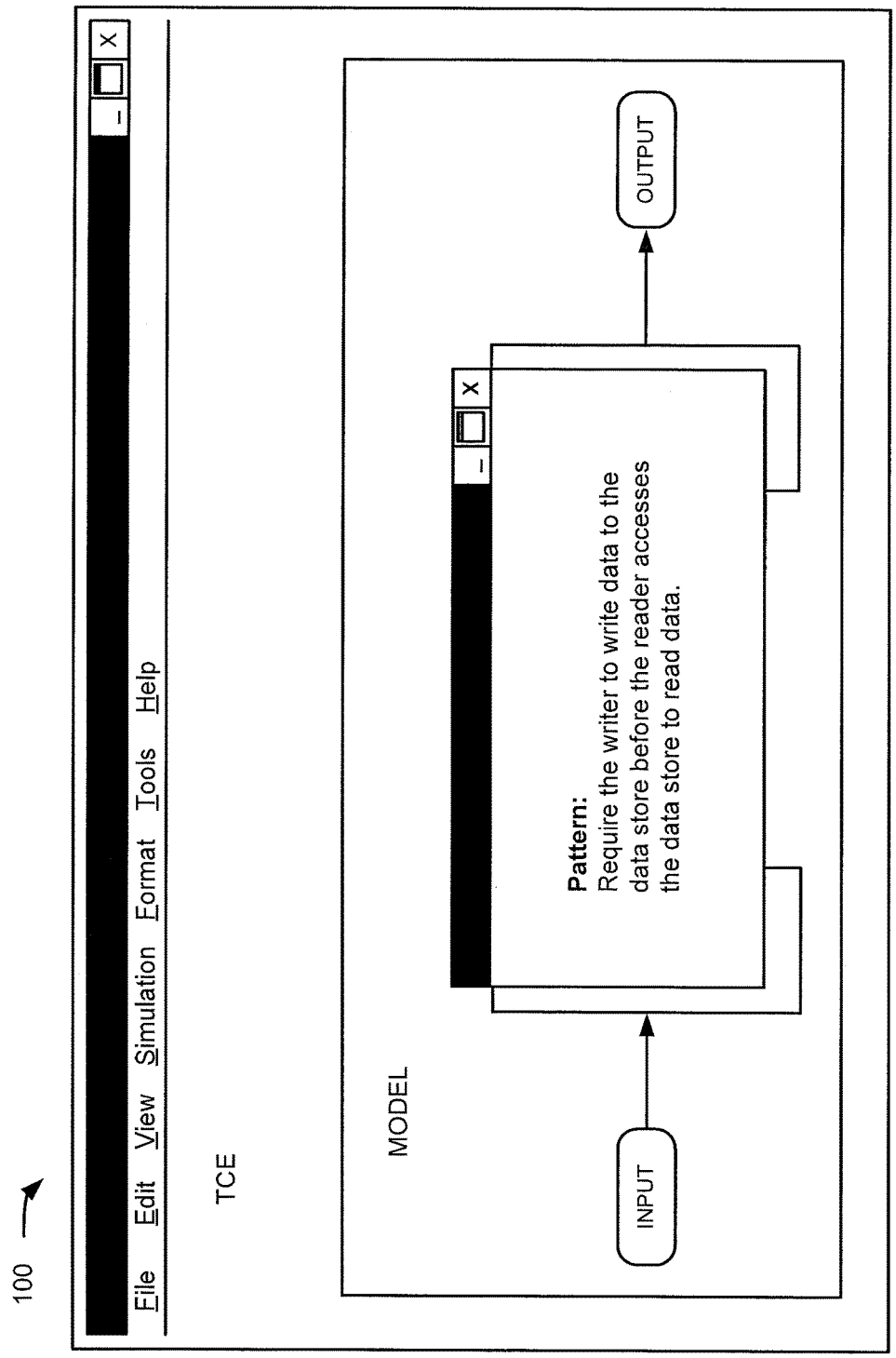
Figure 1C:
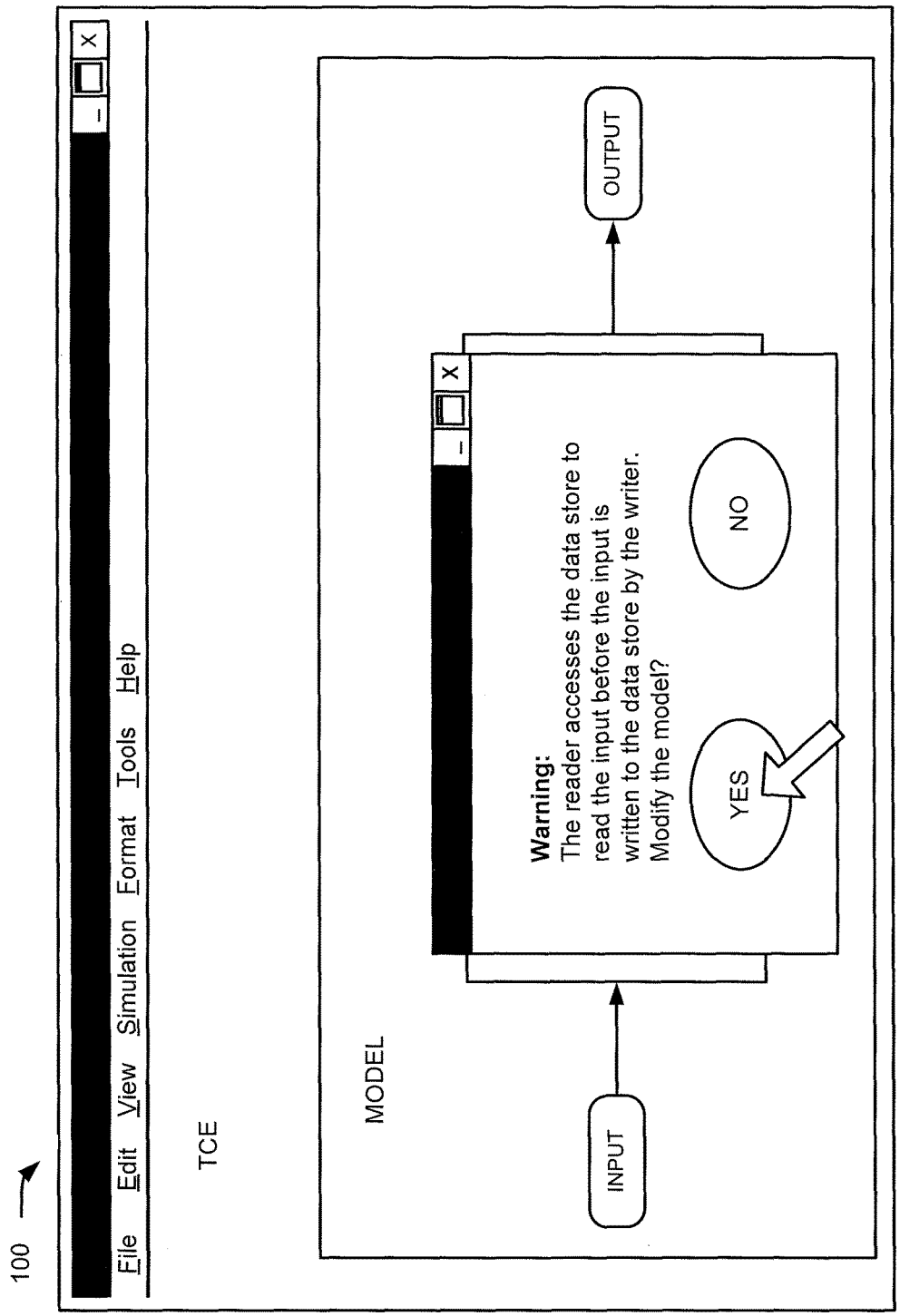

FIGS. 1A-1C are diagrams of an example overview of an implementation described herein. With reference to FIG. 1A, a user may use a TCE to generate a graphical model that includes a writer, a reader, and a data store. A data store may include anything that can hold data in a computing device. For example, a data store can be a datum, data that is passed between functions in a model, a database, a repository, a stack, a heap, a location in a memory, a register, a queue, a mailbox, a buffer, etc. Data held by the data store may be encrypted, compressed, etc. Moreover, the data store may be non-volatile, volatile, etc.

The data store may be represented in a model by one or more entities (e.g., one or more blocks). An entity that writes to the data store may be referred to as a writer. An entity that reads from the data store may be referred to as a reader. For example, a data store may be represented as a block in a graphical block diagram model of a system. The model may further contain a first block that writes a value to the data store (e.g., a writer) and a second block that reads the value (e.g., a reader) written by the first block. In some implementations, the data store may be represented in a model as a graphical affordance that receives inputs from the model.

In some implementations, the data store may be referenced by a textual identifier such as, for example, a variable name with a context (e.g., a function, a state transition diagram, a class instance, methods, procedures, name spaces, etc.) in which this variable can be accessed for read and write operations. In some implementations, the data store may be referenced by a state transition diagram associated with a graphical model.

During execution of the model, the writer may receive an input and may access the data store to write the input to the data store. Also during the execution of the model, the reader may access the data store to read the input written by the writer. The user may want to ensure that the writer writes the input to the data store prior to the reader accessing the data store to read the input. As shown in FIG. 1A, the TCE may display a graphical representation of the model. To input pattern information for the data store, the user may select the graphical representation of the data store being displayed by the TCE. The pattern information may identify the desired pattern associated with the writer and the reader accessing the data store.

With reference to FIG. 1B, in response to the user selecting the data store, the TCE may provide a graphical window for inputting pattern information. As shown in FIG. 1B, the user enters the pattern information as "Require the writer to write data to the data store before the reader accesses the data store to read data" to ensure that the writer writes the input to the data store prior to the reader accessing the data store to read the input. The TCE may receive the pattern information and analyze the model to determine whether the data store is accessed by the writer and the reader in compliance with the pattern information. TCE may generate a result from the analysis and output the result to the user. When TCE determines that the data store is not accessed in compliance with the pattern information, the TCE may output the result as a warning or an error to the user, as shown in FIG. 1C. The warning or error may indicate that the model does access the data store according to the particular pattern and may ask the user if the user would like the model to be modified to enforce the specified constraint on the model. As shown in FIG. 1C, the user selects "YES" to have the model modified, and the TCE may then modify the model to enforce the specified constraint (e.g., cause the writer to write the input to the data store prior to the reader accessing the data store to read the input).

FIG. 2 is a diagram of an example environment 200 in which systems and/or methods, described herein, may be implemented. As illustrated, environment 200 may include a computing device 210 interconnected with a server device 220 via a network 230. Devices of environment 200 may interconnect via wired connections, wireless connections, or a combination of wired and wireless connections.

Computing device may include a device that generates, compiles, and/or executes code to create and/or execute a model. Computing device 210 may include a device that is capable of communicating with server device 220 via network 230. For example, computing device 210 may include a server, a workstation, a mainframe, a computer (e.g., a desktop computer, a laptop computer, a tablet computer, a smart phone, etc.), and/or some other type of computational device.

In some implementations, computing device 210 may host TCE 215. TCE 215 may include hardware-based logic or a combination of hardware and software-based logic that provides a computing environment. TCE 215 may permit a user to perform tasks related to a discipline or a domain. For example, TCE 215 may pertain to mathematics, science, engineering, medicine, business, and/or another type of discipline or domain in a manner similar to that described above. In some implementations, TCE 215 may be hosted by another device, such as server device 220, that is located remotely from computing device 210.

Server device 220 may include one or more server devices, or other types of computation and communication devices. Server device 220 may include a device that is capable of communicating with computing device 210 (e.g., via network 230). In some implementations, server device 220 may include one or more laptop computers, personal computers, workstation computers, servers, central processing units (CPUs), graphical processing units (GPUs), application-specific integrated circuits (ASICs), field-programmable gate arrays (FPGAs), etc. In some implementations, server device 220 may include TCE 215 and may perform some or all of the functionality described herein for computing device 210. Alternatively, server device 220 may be omitted and computing device 210 may perform all of the functionality described herein for computing device 210.

Network 230 may include one or more wired and/or wireless networks. For example, network 230 may include a local area network (LAN), a wide area network (WAN), a metropolitan area network (MAN), a mesh network, an intranet, the Internet, a cellular network, an optical fiber (or fiber optic)-based network, a satellite network, and/or a combination of these or other types of networks.

Although FIG. 2 shows example components of environment 200, in some implementations, environment 200 may include additional components, different components, or differently arranged components than those depicted in FIG. 2. Additionally, or alternatively, one or more components of environment 200 may perform one or more tasks described as being performed by one or more other components of environment 200.

FIG. 3 is a diagram of example components of computing device 210. As shown in FIG. 3, computing device 210 may include a bus 310, a processor 320, a memory 330, storage 340, an input component 350, an output component 360, and/or a communication interface 370.

Bus 310 may permit communication among the other components of computing device 210. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphics processing unit (GPU), a processing core, an application specific integrated circuit (ASIC), an application specific instruction-set processor (ASIP), a system-on-chip (SOC), a programmable logic device (PLD), a chipset, and/or a field programmable gate array (FPGA).

Memory 330 may store data and/or instructions related to the operation and use of computing device 210. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of computing device 210. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storage device external to and/or removable from computing device 210, such as a Universal Serial Bus (USB) memory stick, a hard disk, etc. In an implementation, as illustrated, storage 340 may store TCE 215.

Input component 350 may permit the user and/or another device to input information into computing device 210. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit computing device 210 to output information to the user and/or another device. For example, output component 360 may include a display, a speaker, a light emitting diode (LED), a haptic device, a tactile device, an output port, and/or some other type of output component.

Communication interface 370 may permit computing device 210 to communicate with other devices and/or systems via one or more networks. Communication interface 370 may include a transceiver-like component. For example, communication interface 370 may include an Ethernet interface, an optical interface, a coaxial interface, a radio interface, and/or some other type of wireless and/or wired interface.

As will be described in detail below, computing device 210 may perform certain operations relating to implementations described herein. Computing device 210 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of computing device 210, in some implementations, computing device 210 may include additional components, fewer components, different components, or differently arranged components than those depicted in FIG. 3. Additionally, or alternatively, one or more components of computing device 210 may perform one or more tasks described as being performed by one or more other components of computing device 210.

Figure 4:
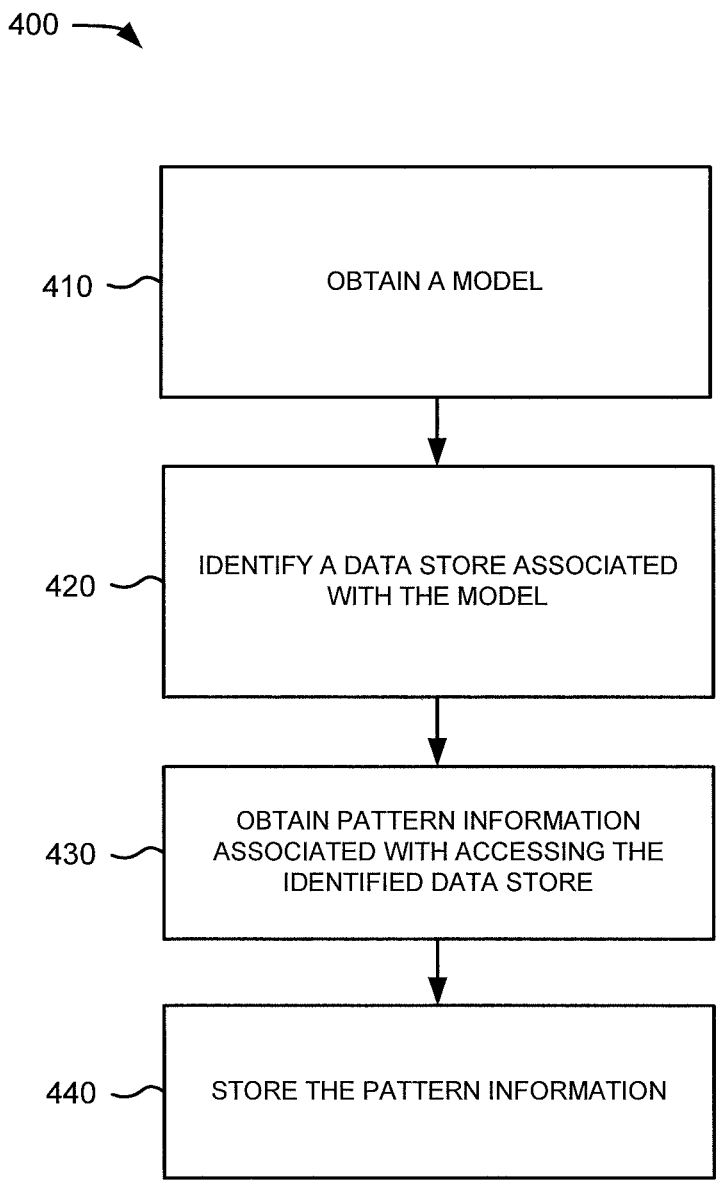
FIG. 4 is a flow chart of an example process for determining pattern information associated with accessing a data store.

FIG. 4 is a flowchart of an example process 400 for determining pattern information associated with accessing a data store. In some implementations, process 400 may be performed by computing device 210 (e.g., TCE 215). In some implementations, one or more blocks of process 400 may be performed by one or more devices instead of, or possibly in conjunction with, computing device 210.

Process 400 may include obtaining a model (block 410). For example, computing device 210 (e.g., TCE 215) may obtain a model. In some implementations, a user may use TCE 215 to generate the model. In some implementations, TCE 215 may obtain the model from a memory associated with computing device 210. For example, computing device 210 (e.g., TCE 215) may receive a request, from a user of computing device 210, to access the model. The request may include information identifying the model, such as a name of the model, and information identifying a memory location at which the model is stored. The memory location may be located within computing device 210 or external to, and possibly remote from, computing device 210. Computing device 210 may, based on receiving the request, retrieve the model from the memory location. In some implementations, computing device 210 may provide, for display, a user interface that depicts all or a portion of the model.

Process 400 may include identifying a data store associated with the model (block 420). For example, computing device 210 (e.g., TCE 215) may identify a data store associated with the model. In some implementations, computing device 210 may analyze the model to identify one or more data stores accessed by the model. For example, computing device 210 may analyze the model to identify elements of the model that represent data stores. In some implementations, computing device 210 may analyze the model to identify the data store as the model is being created. For example, a user may be creating a model in a graphically-based modeling environment and computing device 210 may determine that a particular graphical element (e.g., a block), corresponding to a data store, has been inserted into the model.

In some implementations, computing device 210 may identify the data store based on executable code associated with the model. For example, computing device 210 may parse the executable code to identify portions of the model corresponding to data stores. Other ways of identifying a data store associated with the model may alternatively be used.

Additionally, or alternatively, computing device 210 may identify a data store that is not included in the model. For example, computing device 210 may analyze the model and/or the executable code and determine that the model references a data store that is included in another model. Computing device 210 may identify the data store included in the other model based on the reference.

In some implementations, computing device 210 may identify the data store based on receiving a selection of a data store from a user. For example, a user may select a block of a model corresponding to a data store using a mouse (e.g., input component 350) or in some other manner. In some implementations, the model may include a system of equations that access a shared memory location. The data store may not impose a causal relation among variables in the system of equations. A user may select an identifier associated with the shared memory location. Computing device 210 may identify the shared memory location based on the selection of the identifier.

Process 400 may include obtaining pattern information associated with accessing the identified data store (block 430). For example, computing device 210 (e.g., TCE 215) may obtain pattern information for the identified data store. In some implementations, computing device 210 may receive the pattern information from a user. For example, computing device 210 may receive a request to provide pattern information. Computing device 210 may provide, based on receiving the request, a user interface that allows the user to specify the pattern information. Computing device 210 may receive the pattern information via the user interface. In some implementations, computing device 210 may receive the request based on the user selecting a graphical representation of a data store using a mouse (e.g., input component 350) or in some other manner. For example, based on the user right-clicking on a block corresponding to a data store, computing device 210 may cause a pop-up menu to appear via which the user may request to provide pattern information for the data store.

In some implementations, computing device 210 may obtain the pattern information from another device. For example, computing device 210 may obtain the pattern information from server device 220. In some implementations, computing device 210 may receive the pattern information in conjunction with receiving the model. For example, computing device 210 may receive the model from server device 220 and the pattern information may be included in the model.

In some implementations, computing device 210 may request the pattern information and may obtain the pattern information based on the request. For example, computing device 210 may request the pattern information from server device 220. In some implementations, the request may include information identifying the model (e.g., a name of the model, an identifier associated with the model, etc.) and server device 220 may retrieve pattern information based on the information identifying the model.

In some implementations, the pattern information may identify a pattern associated with accessing the data store. For example, the pattern information may identify the pattern as read before write, write before read, multiple writes before a read, performing a nominal or unconditional (e.g., occurring every time step) read operation before performing a conditional (e.g., may or may not occur every time step depending on satisfaction of a condition) read operation, etc. In some implementations, the pattern information may identify the pattern based on temporal requirements associated with accessing the data store. For example, the pattern information may identify the pattern as performing a write operation within a particular amount of time after receiving data to be written, performing a read operation within a particular amount of time after a write operation is performed, etc.

In some implementations, the model may include a graphical affordance representing the data store. The data store may receive inputs from the model and the temporal requirements may be defined in terms of the data store receiving one or more of the inputs. For example, the data store may receive a first input and a second input from the model. The pattern information may indicate that the second input should not be received within a particular amount of time (e.g., 1 second) from the data store receiving the first input.

In some implementations, the pattern information may include information that indicates that the pattern information is to be associated with the model, a portion of the model, and/or one or more model elements. For example, the pattern information may include information that indicates that the pattern information is to be associated with the entire model (e.g., every model element included in and/or referenced by the model), portions of the model that perform a particular function and/or operation (e.g., portions of the model that write data to the data store, portions of the model that read data from the data store, etc.), model elements included in a particular hierarchy of the model, portions of other models that access the data store, particular model elements (e.g., blocks) included in the model, particular model elements included in other models, etc.

In some implementations, the pattern information may identify model elements that are not to be associated with the pattern information. For example, the pattern information may include information that indicates that the pattern information is not to be associated with the entire model (e.g., the pattern information is only to be associated with portions of other models that access the data store), portions of the model that perform a particular function and/or operation (e.g., portions of the model that write data to the data store, portions of the model that read data from the data store, etc.), model elements included in a particular hierarchy of the model, portions of other models that access the data store, particular model elements (e.g., blocks) included in the model, particular model elements included in other models, etc.

In some implementations, the pattern information may identify the model and/or a model element that is to be associated with the pattern information using a name or other identifier associated with the model and/or the model element, a function performed by the model element, a hierarchy level of the model, and/or any other information that enables computing device 210 to determine the model and/or model elements that are to be associated with the pattern information. In some implementations, the pattern information may include elements from a regular expression. For example, the pattern information may include a wildcard or other identifier that indicates that the pattern information is to be associated with every model element, every data store, and/or every model element that accesses a particular data store. For example, to indicate that the pattern information is to be associated with every model element that accesses a particular data store, the pattern information may include the wildcard or other identifier and information identifying the particular data store.

In some implementations, the pattern information may identify constraint information associated with accessing the data store according to an identified pattern. The constraint information may include information that indicates that the data store should be accessed according to the pattern. For example, the constraint information may indicate that accessing the data store according to the pattern is desired or required. In some implementations, the constraint information may indicate that the data store should not be accessed according to a particular pattern. For example, the constraint information may indicate that accessing the data store according to the pattern is undesirable or forbidden.

In some implementations, the constraint information may be associated with a level of priority. For example, constraint information indicating that a data store is required to be accessed according to a particular pattern may have a higher level of priority than constraint information indicating that a data store should be accessed according to a particular pattern. In some implementations, the pattern information may include information that identifies the level of priority associated with the constraint information.

Process 400 may include storing the pattern information (block 440). For example, computing device 210 (e.g., TCE 215) may store the determined pattern information in a memory associated with computing device 210 (e.g., memory 330). In some implementations, computing device 210 may store the pattern information in association with data identifying the data store that is identified in the pattern information. In some implementations, computing device 210 may store the pattern information in association with data identifying the model with which the pattern information is associated.

While FIG. 4 shows process 400 as including a particular quantity and arrangement of blocks, in some implementations, process 400 may include fewer blocks, additional blocks, or a different arrangement of blocks. Additionally, or alternatively, some of the blocks may be performed in parallel.

Figure 5A:
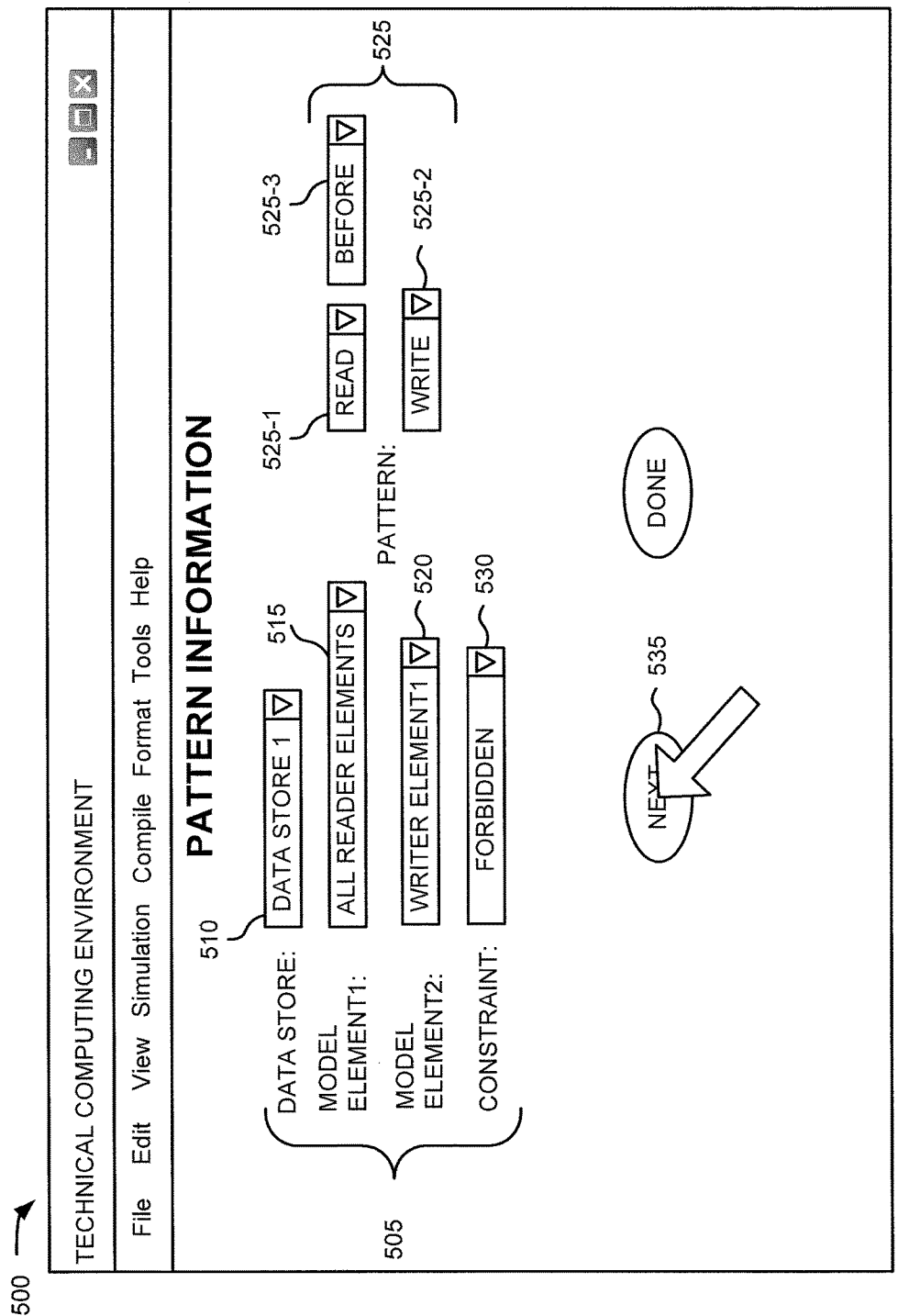
FIGS. 5A-5E are an example of the process described in connection with FIG. 4.
Figure 5B:
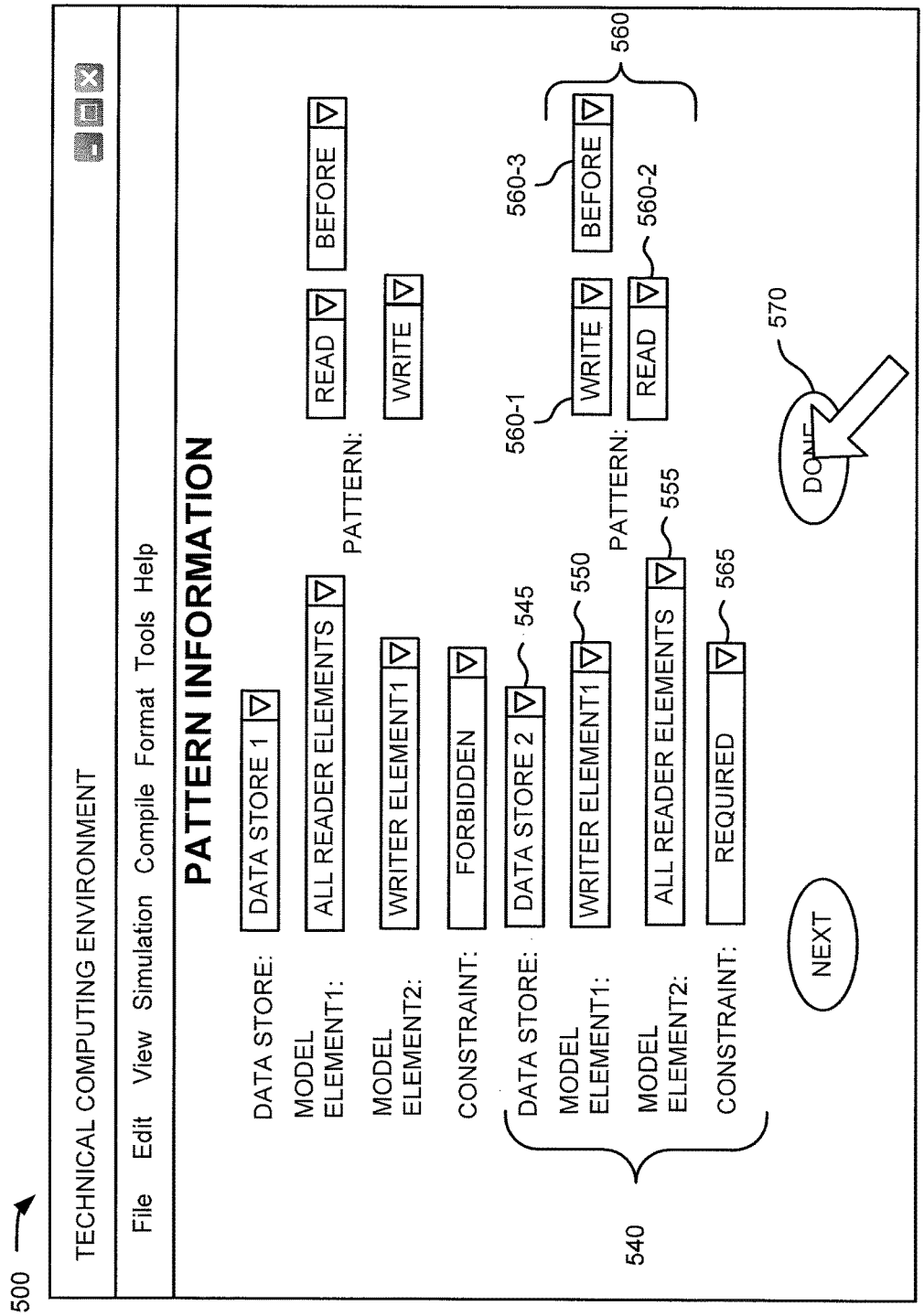
Figure 5C:
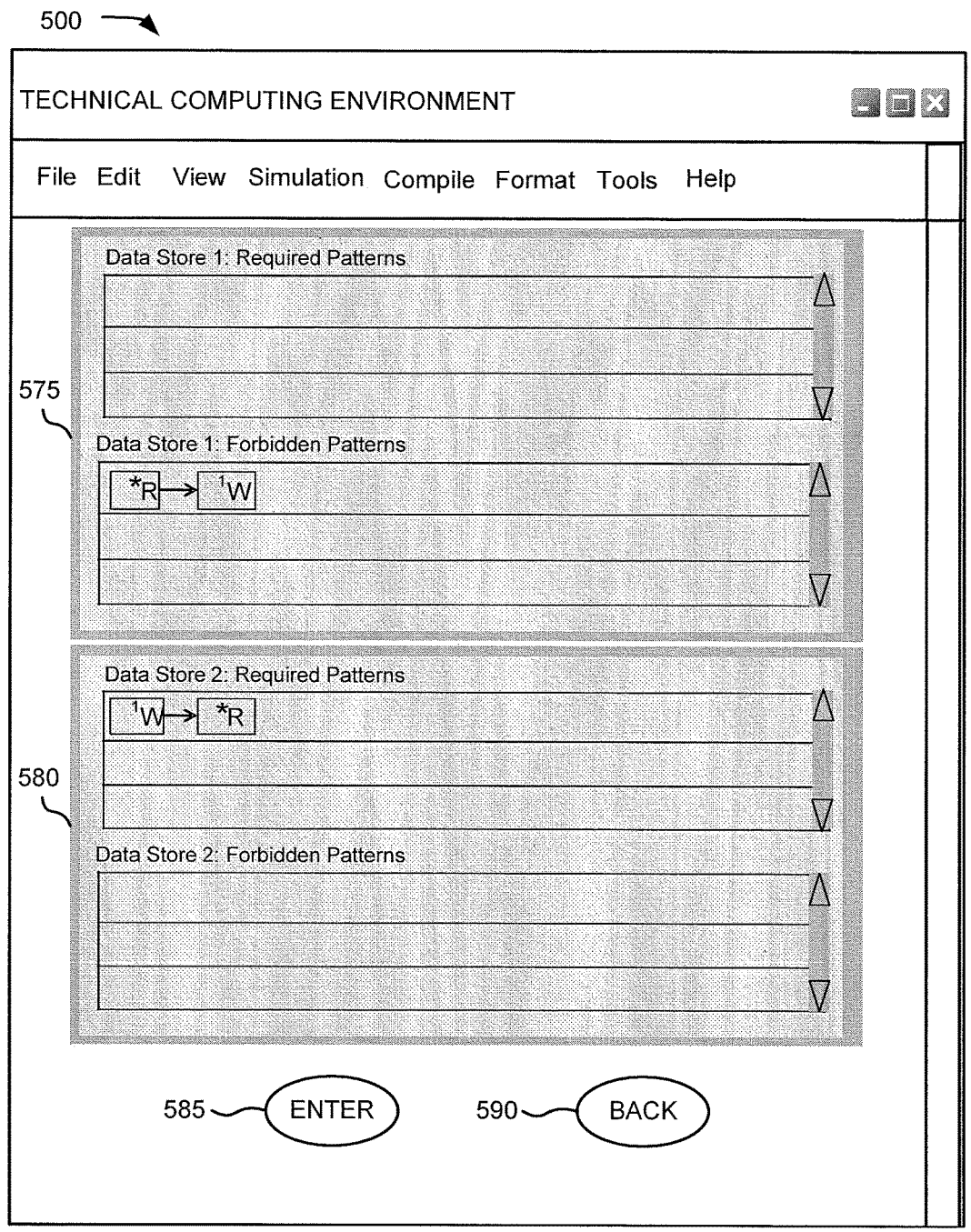

FIGS. 5A-5C are an example 500 of the process described in connection with FIG. 4. Assume that a model includes two data stores ("DATA STORE 1" and "DATA STORE 2"). Assume that the model further includes writer elements that write first inputs to DATA STORE 1 and write second inputs to DATA STORE 2. Assume that the model also includes reader elements that read the first inputs from DATA STORE 1 and read the second inputs from DATA STORE 2. Assume that a user does not want any of the reader elements to access DATA STORE 1 to read the first inputs prior to a particular writer element ("WRITER ELEMENT1") writing a first input to DATA STORE 1. Assume further that the user wants the particular writer element to write a second input to DATA STORE 2 before any of the reader elements access DATA STORE 2 to read the second inputs. Assume that the user has requested to provide pattern information and that a TCE (e.g., TCE 215) has provided a user interface that allows the user to specify the pattern information.

As shown in FIG. 5A, the user interface includes input block 505. Input block 505 may enable the user to identify a particular data store and provide pattern information for the identified data store. As further shown in FIG. 5A, the user interface may include a field 510 that allows the user to identify a data store, or a group of data stores (e.g., all data stores, all data stores included in a particular subhierarchy of the model, etc.) associated with the model. In some implementations, field 510 may take the form of a pull-down menu, which may be pre-populated with information identifying the data stores, or groups of data stores, included in the model.

The user interface may further include field 515 and field 520 that allow the user to identify model elements, or groups of model elements (e.g., all reader elements, all writer elements, etc.), that access the data store identified in field 510. In some implementations, field 515 and field 520 may take the form of pull-down menus, which may be pre-populated with information identifying model elements, or groups of model elements, that access the data store identified in field 510.

The user interface may further include field 525 that allows the user to identify a pattern associated with the model elements identified in fields 515 and 520. In some implementations, field 525 may take the form of a multiple pull-down menus 525-1, 525-2, and 525-3. Pull-down menu 525-1 may be pre-populated with information identifying possible operations that the model element identified in field 515 may access the data store to perform. Example operations may include a read operation, a write operation, a conditional write operation, a nominal write operation, etc. Pull-down menu 525-2 may be pre-populated with information identifying possible operations that the model element identified in field 520 may access the data store to perform. Example operations may include a read operation, a write operation, a conditional write operation, a nominal write operation, etc. Pull-down menu 525-3 may be pre-populated with information related to specifying an order in which the operation identified in pull-down menu 525-1 is to be performed relative to the operation identified in pull-down menu 525-2. Example orders may include before, after, simultaneously, etc.

The user interface may further include field 530 that allows the user to specify constraint information associated with the model elements identified in fields 515 and 520 accessing the data store identified in field 510 according to the pattern identified in field 525. In some implementations, field 530 may take the form of a pull-down menu that is pre-populated with information identifying possible constraint information associated with the pattern identified in field 525. Example constraints may include desirable constraints (e.g., required, should, etc.), undesirable constraints (e.g., forbidden, should not, etc.), anomalous constraints, etc.

For example, an analysis of the mode may reveal certain patterns (e.g., read and/or write patterns) in the model with respect to accessing one or more of the data stores that may be considered, for example, desirable, undesirable, and/or anomalous. For example, pattern information that includes constraint information that indicates that a pattern is a forbidden, undesirable, and/or anomalous pattern may include information indicating that a reader in the model reading the data store before the data store is written by a writer is a forbidden, undesirable, and/or anomalous pattern. The user interface may enable these and other patterns to be identified.

The user interface may further include field 535 that allows the user to request to provide additional pattern information for the model. In some implementations, field 535 may take the form of a button that the user can select to indicate whether the user desires to input additional pattern information for the model.

As shown in FIG. 5A, assume that the user has used pull-down menu 510 to identify that the pattern information is to be associated with DATA STORE 1 and has used pull-down menus 515-530 to indicate that all of the reader elements ("ALL READER ELEMENTS") should not ("FORBIDDEN") read ("READ") data from DATA STORE 1 prior to ("BEFORE") the writer element ("WRITER ELEMENT1") writing data ("WRITE") to DATA STORE 1. The user then selects button 535 ("NEXT") to request to provide additional pattern information for the model.

As shown in FIG. 5B, assume that in response to the user selecting button 535 ("NEXT"), TCE 215 provides a user interface that allows the user to specify the additional pattern information. As shown in FIG. 5B, the user interface includes input block 540. Input block 540 may enable the user to identify a particular data store and provide pattern information for the identified data store in a manner similar to that described with respect to input block 505.

As shown in FIG. 5B, assume that the user has used pull-down menu 545 to identify that the additional pattern information is to be associated with DATA STORE 2 and has used pull-down menus 550-565 to indicate that the writer element ("WRITER ELEMENT1") should ("REQUIRED") write ("WRITE") data to DATA STORE 2 prior ("BEFORE") any of the reader elements ("ALL READER ELEMENTS") read data ("READ") from DATA STORE 2. The user then selects button 570 ("DONE") to indicate that the user does not desire to input any additional pattern information for the model.

Referring now to FIG. 5C, in response to the user selecting button 570, TCE 215 may provide confirmation information to allow the user to verify the pattern information that is to be associated with each of the data stores. As shown in FIG. 5C, TCE 215 outputs confirmation information 575 that shows the pattern information input for DATA STORE 1 and confirmation information 580 that shows the pattern information input for DATA STORE 2. The user may select button 585 ("ENTER") to cause the pattern information to be associated with the data stores or button 570 ("BACK") to indicate that the user desires to modify the pattern information and/or add additional pattern information for the model. If TCE 215 determines that the user has selected button 585, TCE 215 may store the pattern information as described above in connection with block 440. If TCE 215 determines that the user has selected button 590, TCE 215 may provide a user interface (e.g., the user interface shown in FIG. 5B) that allows the user to modify the pattern information (e.g., by using pull-down menus 550-565) and/or add additional pattern information (e.g., by selecting "NEXT").

Figure 5D:
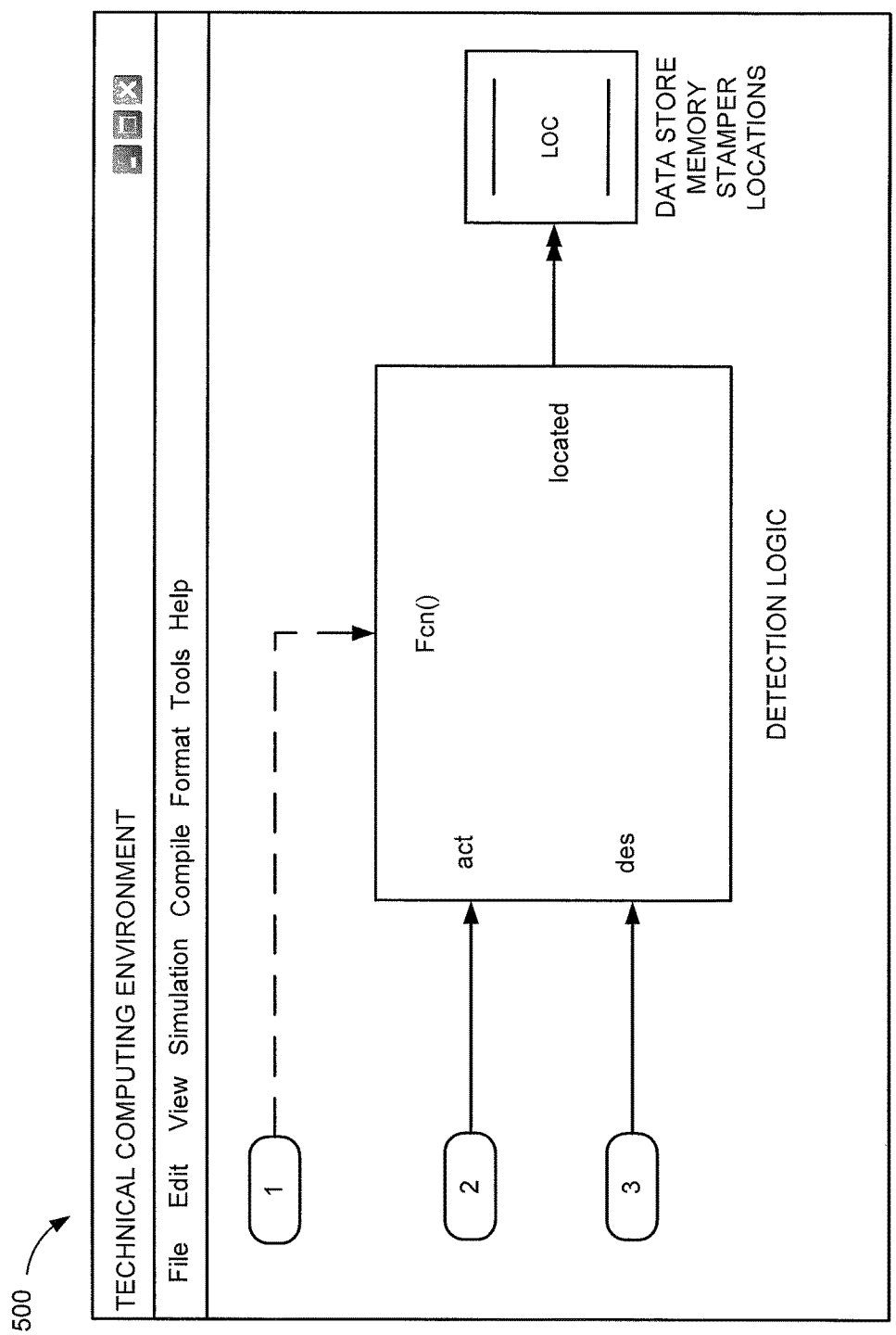

Referring now to FIG. 5D, assume that a model includes a graphical affordance of a data store that receives signals (e.g., variables) from the model. Further, assume that the user desires to define pattern information for the signals in terms of temporal requirements associated with the signals received by the data store. As shown in FIG. 5D, TCE 215 may connect the signals received by the data store as a signal, represented by a double-headed arrow, to an input port for the block "DATA STORE MEMORY STAMPER LOCATIONS."

Figure 5E:
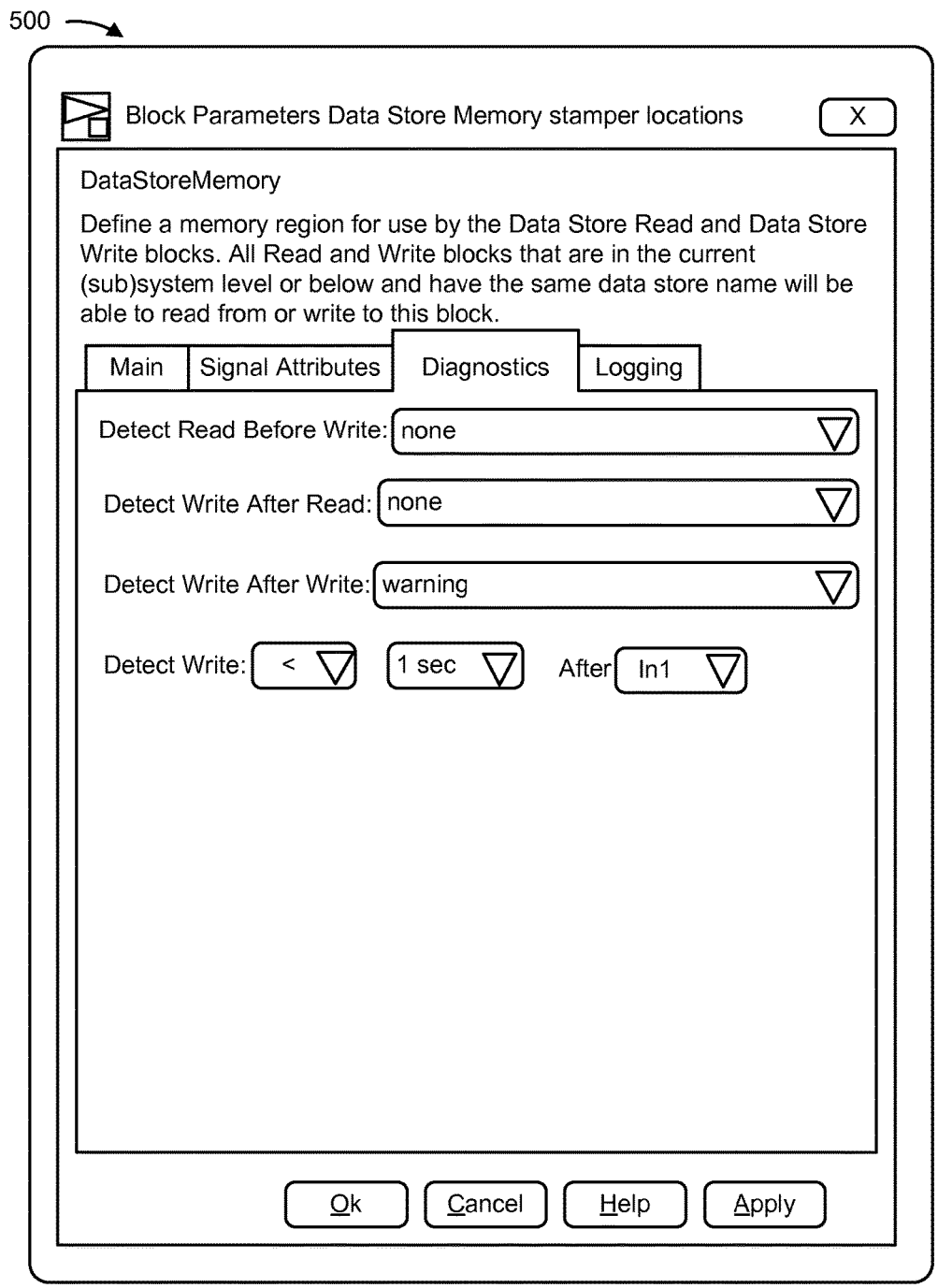

Referring now to FIG. 5E, assume that the user has requested to provide pattern information by selecting the block, and that TCE 215 has provided a user interface that allows the user to define the pattern information in terms of temporal requirements for the signals received by the data store. The user interface may provide pull-down menus that enable the user to define pattern information for the signals. As shown in FIG. 5E, the user may use the pull-down menus to indicate that the data store memory should be written less than 1 second after an input signal ("In1") is written.

Figure 6:
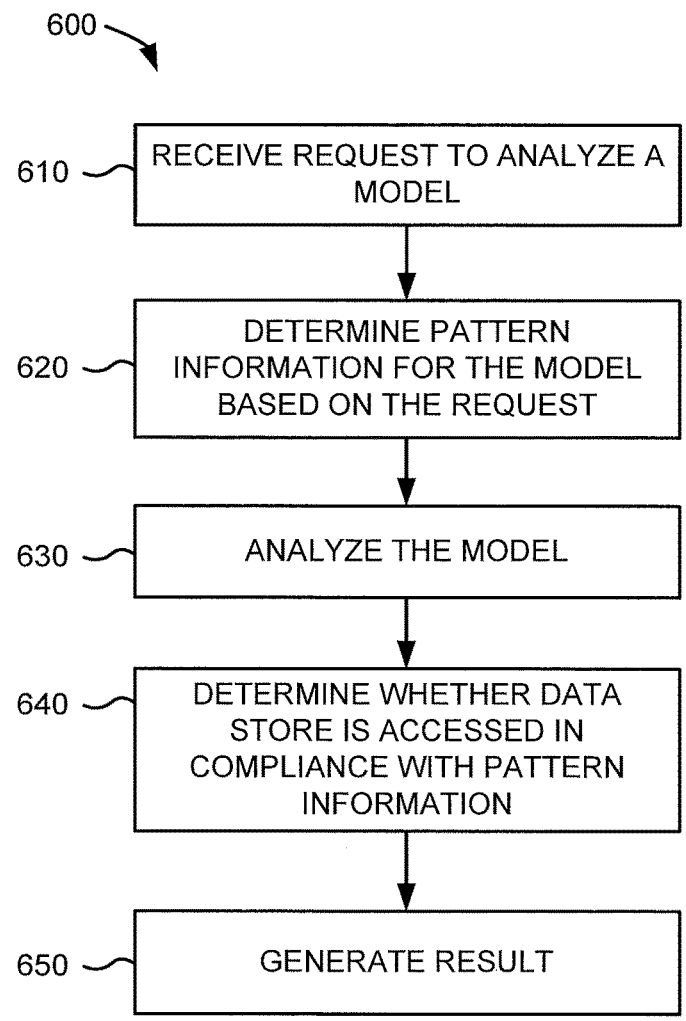
FIG. 6 is a flow chart of an example process for whether a data store is accessed in compliance with pattern information during execution of a model.

FIG. 6 is a flowchart of an example process 600 for determining whether a data store is accessed in compliance with pattern information during execution of a model. In some implementations, process 600 may be performed by computing device 210 (e.g., TCE 215). In some implementations, one or more blocks of process 600 may be performed by one or more devices instead of, or possibly in conjunction with, computing device 210.

Process 600 may include receiving a request to analyze a model (block 610). For example, computing device 210 (e.g., TCE 215) may receive a request to analyze a model. In some implementations, computing device 210 may receive the request from a user via a user interface that allows the user to input commands relating to the model. For example, computing device 210 may provide a user interface that includes a menu bar that includes various menu items. The menu items may include a menu item that, when selected, causes the model to be analyzed. Thus, the user may select the menu item and computing device 210 may receive the request to analyze the model as a result of the selection.

Process 600 may include determining pattern information for the model based on the request (block 620). For example, computing device 210 (e.g., TCE 215) may determine pattern information for the model based on the request. In some implementations, the request may include the pattern information and computing device 210 may parse the request to determine the pattern information. In some implementations, the request may include information identifying a storage location for the pattern information that enables computing device 210 to obtain the pattern information.

In some implementations, the request may include an identifier or other information identifying the model and/or the data store. Computing device 210 may use the identifier or other information identifying the model and/or the data store to determine the pattern information. For example, pattern information may have been stored in association with information identifying the model and/or the data store as described in connection with block 440 and computing device 210 may retrieve the stored pattern information using the identifier or other information included in the request.

Process 600 may include analyzing the model (block 630) and determining whether the data store is accessed in compliance with the pattern information (block 640). For example, computing device 210 (e.g., TCE 215) may analyze the model and determine whether the data store is accessed in compliance with the pattern information. In some implementations, computing device 210 may determine a set of constraints for a sorted order for the model based on the pattern information. Based on the set of constraints, computing device 210 may determine whether a sorted order for the model can be computed such that the data store is accessed in compliance with a pattern identified in the pattern information during an execution of the model. For example, computing device 210 may use a sorting algorithm and/or a scheduling algorithm to determine whether the sorted order for the model can be computed.

In some implementations, computing device 210 may determine that the sorted order for the model is fixed (e.g., there is only one possible sorted order for the model). Computing device 210 may determine whether the data store is accessed in compliance with the pattern information based on the fixed sorted order. For example, computing device 210 may use Satisfiability-Modulo Theory (SMT) and/or mixed logical/linear programming to determine whether the sorted order causes the data store to be accessed in compliance with the pattern information.

In some implementations, computing device 210 may analyze the model and may determine that multiple different sorted orders can be generated for the model (e.g., the sorted order is not fixed). Computing device 210 may determine whether the data store is accessed in compliance with the pattern information for each possible sorted order that can be generated for the model. In some implementations, computing device 210 may determine that the data store is accessed in compliance with the pattern information when the data store is accessed in compliance with the pattern information for each of the possible sorted orders. In some implementations, computing device 210 may determine that the data store is accessed in compliance with the pattern information when the data store is accessed in compliance with the pattern information for a particular quantity and/or percentage of the possible sorted orders.

In some implementations, when computing device 210 determines that the data store is accessed in compliance with the pattern information for some, but not all, of the possible sorted orders, computing device 210 may modify the sorting algorithm and/or the scheduling algorithm to cause the sorted order to include one of the sorted orders that accesses the data store in compliance with the pattern information. For example, computing device 210 may add a constraint to the sorting algorithm and/or the scheduling algorithm. The constraint may cause the sorted order to be generated so that, during execution of the model, the data store is accessed in compliance with the pattern information.

In some implementations, computing device 210 may analyze the model to determine an execution time for model elements included in the model (e.g., a logical execution time and/or a physical execution time representing a physical amount of time required for the model element to be executed). Computing device 210 may determine whether the data store is accessed in compliance with the pattern information based on the determined execution times. For example, computing device 210 may analyze the model and determine that model elements identified in the pattern information are included on parallel branches of the model (e.g., that the model elements execute in parallel). Computing device 210 may determine the execution times for model elements based on the model elements being included in the parallel branches.

In some implementations, the execution times may include logical execution times for the model elements. For example, computing device 210 may simulate an execution of the model. Computing device 210 may determine logical execution times for the model elements based on the simulation. Additionally, or alternatively, the execution times may include physical execution times for the model elements. For example, computing device 210 may determine a physical amount of time that it takes each of the model elements to execute.

In some implementations, computing device 210 may employ approximations of functionality in the model. For example, computing device 210 may convert floating-point arithmetic computations to rational-number arithmetic computations. Computing device 210 may analyze the model based on the approximations to determine whether the data store is accessed in compliance with the pattern information. For example, computing device 210 may analyze the model based on the approximations to determine write times and read times associated with writers (e.g., writer blocks) that write data to the data store and readers (e.g., reader blocks) that read data from the data store. Computing device 210 may determine whether the data store is accessed in compliance with the pattern information based on the write times and the read times.

In some implementations, computing device 210 may generate an execution control graph that represents an execution of the model. Computing device 210 may analyze the execution control graph to determine whether the data store is accessed in compliance with the pattern information. For example, based on the pattern information, computing device 210 may identify the data store and determine a pattern and constraint information associated with accessing the data store. Computing device 210 may analyze the execution control graph to determine whether the data store is accessed in compliance with the pattern and constraint information. For example, computing device 210 may generate an expression based on the execution control graph and a condition. The condition may represent the pattern and the constraint information. Computing device 210 may determine whether the data store is accessed in compliance with the pattern information based on whether the expression is satisfiable.

In some implementations, the model may include a system of equations that access a data store shared memory location. Computing device 210 may determine which equation computes which variable as an assignment (e.g., make the equations causal if the equations are not causal already) and may order the equations into a sequence. In the system of equations, the data store shared memory location may not enforce and/or provide causality and/or ordering information. Computing device 210 may determine whether the data store shared memory location is accessed in compliance with the pattern based on the sequence. If the shared memory location is not accessed in compliance with the pattern, computing device 210 may reorder the equations. Causality and/or ordering information about the data store shared memory location may be generated for the reordering.

In some implementations, the pattern information may identify one or more patterns associated with the data store shared memory location and computing device 210 may reorder the equations such that the data store shared memory location is accessed in compliance with each of the one or more patterns.

In some implementations, the pattern information may identify multiple patterns and computing device 210 may reorder the equations such that the data store shared memory location is accessed in compliance with some, but not all, of the patterns. For example, the pattern information may identify a level of priority associated with each pattern. Computing device 210 may reorder the equations such that the data store shared memory location is accessed in compliance with patterns having a higher level of priority.

As an example, assume that pattern information identifies a first pattern associated with a high priority and a second pattern associated with a low priority and that computing device 210 determines that the equations cannot be ordered such that the data store shared memory location is accessed in compliance with both the first pattern and the second pattern. Computing device 210 may reorder the equations such that the data store shared memory location is accessed according to the first pattern based on the first pattern being associated with the high priority.

Process 600 may include generating a result (block 650). For example, computing device 210 (e.g., TCE 215) may generate a result. In some implementations, computing device 210 may generate a result that indicates whether the data store is accessed in compliance with the pattern information. In some implementations, computing device 210 may generate a result that indicates portions of the model that access the data store in compliance with the pattern information and/or portions of the model that do not access the data store in compliance with the pattern information.

In some implementations, computing device 210 may output the result. For example, computing device 210 may output the result to cause the result to be displayed via a user interface. In some implementations, computing device 210 may store the result (e.g., in memory 330).

In those situations where the data store is not accessed in compliance with the pattern information, computing device 210 may generate a result that includes information for modifying the model to cause the data store to be accessed in compliance with the pattern information. For example, computing device 210 may generate a result that indicates that the data store is not accessed in compliance with the pattern information and includes information indicating one or more possible modifications to the model to cause the data store to be accessed in compliance with the information. In some implementations, computing device 210 may output the result to a user and, in response to the result, the user may select one of the possible modifications to the model. Computing device 210 may cause the model to be modified based on the selection. For example, a physical execution analysis of the model may be performed and, based on the physical execution analysis, one or more delay elements may be added to the model and/or a sorting rule may be added to enforce compliance with the pattern information.

In some implementations, computing device 210 may generate a result that includes information identifying modifications to the model. For example, computing device 210 may generate a result that includes information indicating that the model was determined not to access the data store in compliance with the pattern information and that the model was modified to cause the data store to be accessed in compliance with the information. In these situations, the result may also include an option that allows the user to undo the modifications.

While FIG. 6 shows process 600 as including a particular quantity and arrangement of blocks, in some implementations, process 600 may include fewer blocks, additional blocks, or a different arrangement of blocks. Additionally, or alternatively, some of the blocks may be performed in parallel.

Figure 7A:
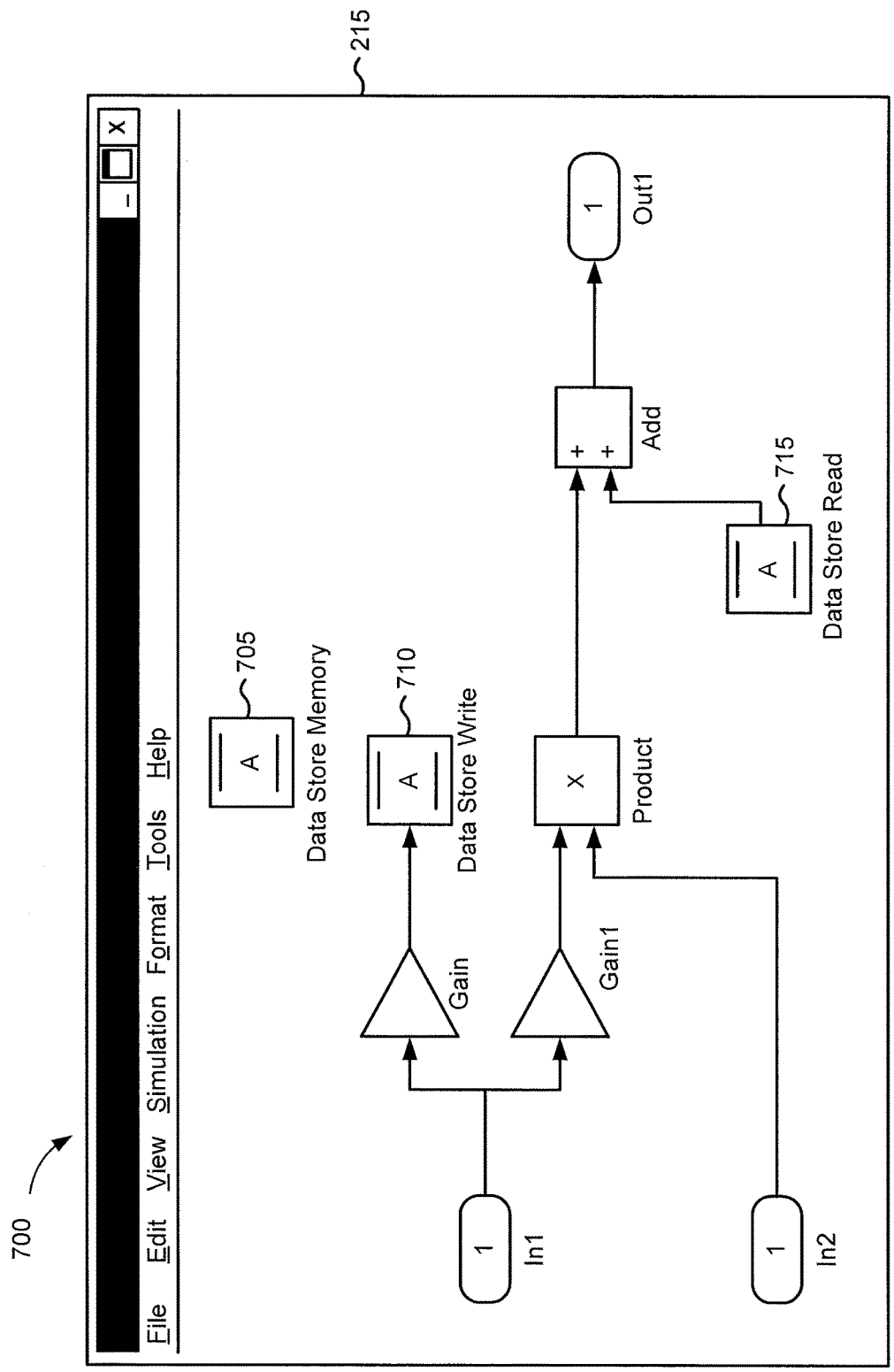

FIGS. 7A-7I are an example 700 of the process described in connection with FIG. 6. With reference to FIG. 7A, assume that a model has been created in TCE 215 and that TCE 215 has generated executable code for the model. Assume that TCE 215 has obtained pattern information for Data Store Memory block 705 and that, based on the pattern information, TCE 215 has determined that Data Store Write block 710 should write data to Data Store Memory block 705 prior to Data Store Read block 715 accessing Data Store Memory block 705 to read data. Assume that TCE 215 determines a sorted order based on the executable code.

Figure 7C:
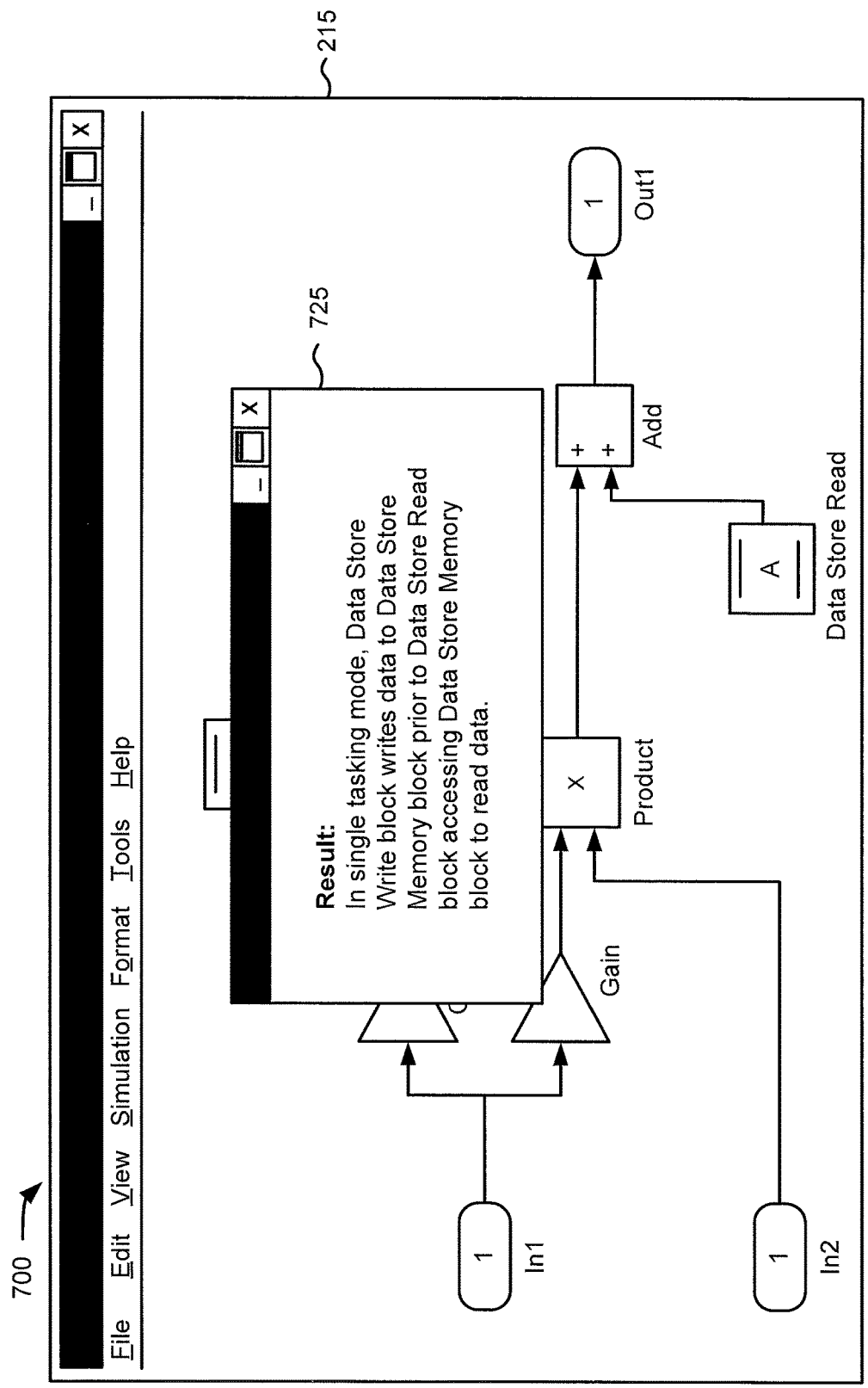

Referring now to FIGS. 7B-7C, assume that the model is to be executed in a single tasking mode. As shown in FIG. 7B, TCE 215 determines a sorted order 720 for the model that includes a single list ("TASK 1") that is to be executed on a single computing resource. Sorted order 720 indicates that Data Store Write block 710 executes to write data to Data Store Memory block 705 prior to Data Store Read block 715 executing to read data from Data Store Memory block 705. Thus, TCE 215 determines that Data Store Memory block 705 is accessed in compliance with the pattern information. As shown in FIG. 7C, TCE 215 outputs, via graphical window 725, a result indicating that Data Store Write block 710 writes data to Data Store Memory block 705 prior to Data Store Read block 715 accessing Data Store Memory block 705 to read data.

Figure 7D:
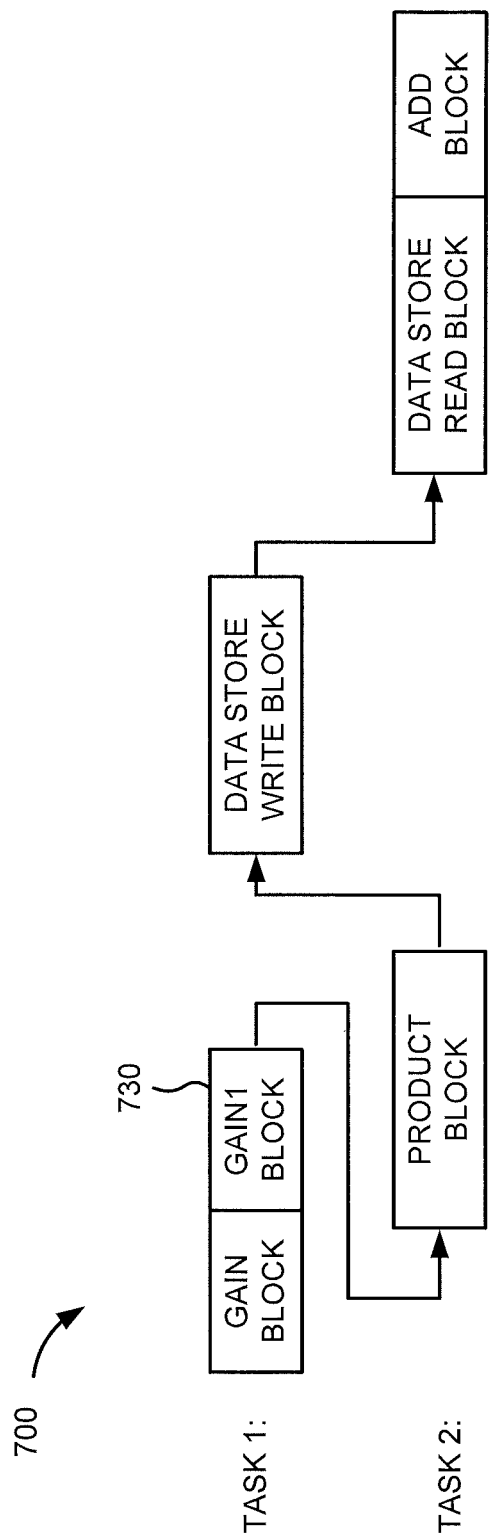
Figure 7E:
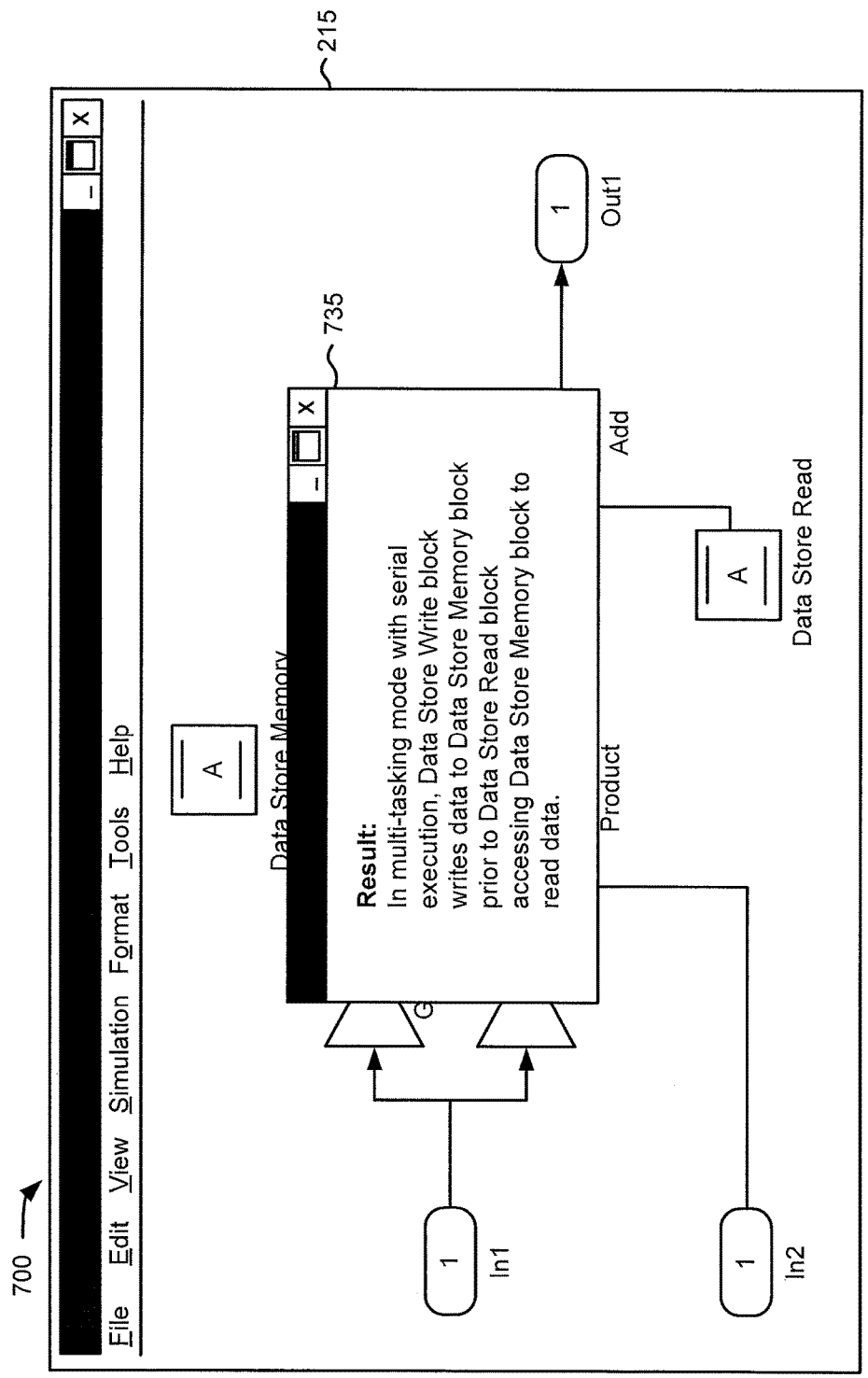

Referring now to FIGS. 7D-7E, assume that the model is to be executed in a multi-tasking mode with serial execution. As shown in FIG. 7D, TCE 215 determines a sorted order 730 that includes multiple lists ("TASK 1" and "TASK 2") that are to be executed in serial on a single computing resource. TCE 215 determines sorted order 730 as an interleaving result of TASK 1 and TASK 2. Sorted order 730 indicates that Data Store Write block 710 executes to write data to Data Store Memory block 705 prior to Data Store Read block 715 executing to read data from Data Store Memory block 705. Thus, TCE 215 determines that Data Store Memory block 705 is accessed in compliance with the pattern information. As shown in FIG. 7E, TCE 215 outputs, via graphical window 735, a result indicating that Data Store Write block 710 writes data to Data Store Memory block 705 prior to Data Store Read block 715 accessing Data Store Memory block 705 to read data.

Figure 7F:
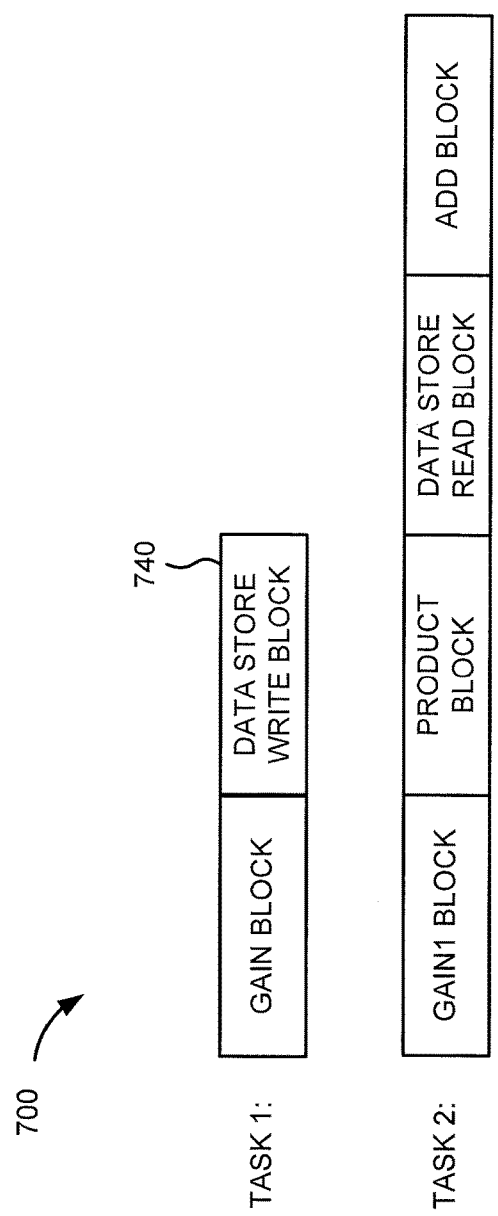
Figure 7G:
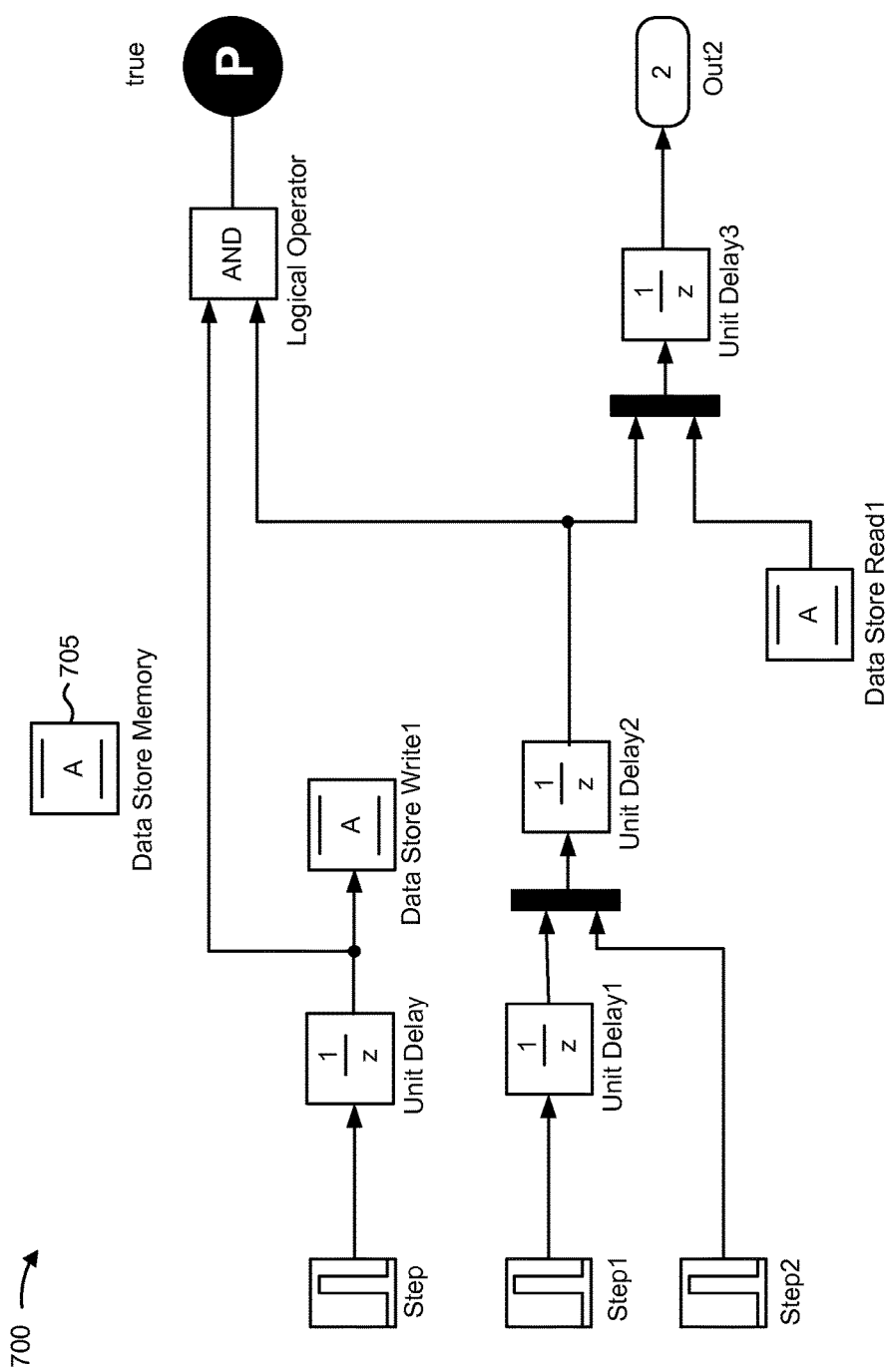
Figure 7H:
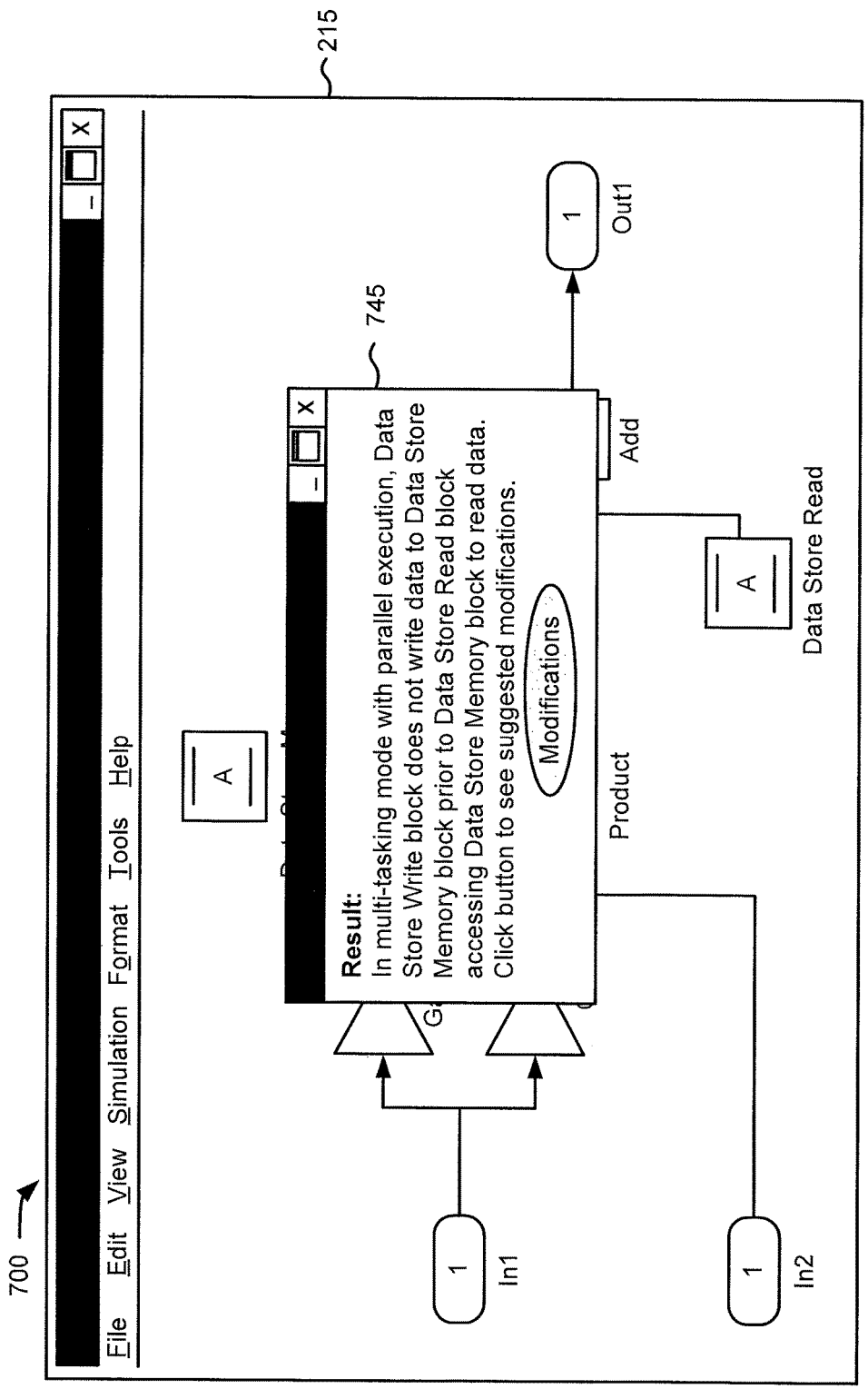

Referring now to FIGS. 7F-7H, assume that the model is to be executed in a multi-tasking mode with concurrent execution. As shown in FIG. 7F, TCE 215 determines a sorted order 740 that includes multiple lists ("TASK 1" and "TASK 2") that are to be executed concurrently on multiple computing resources. TCE 215 performs a physical time analysis of the model to determine whether sorted order 740 results in Data Store Write block 710 writing data to Data Store Memory block 705 prior to Data Store Read block 715 accessing Data Store Memory block 705.

For example, TCE 215 may analyze and/or execute the model to obtain characteristics relating to the model. The characteristics may include any characteristics of the model that may be used to represent behavior of the blocks of the model. For example, the characteristics may include characteristics relating to the individual blocks, characteristics relating to the interconnection of the blocks in the model, and/or characteristics relating to an execution order of the blocks in the model. Other characteristics may also or alternatively be obtained.

In some implementations, TCE 215 may identify characteristics relating to a physical time delay associated with each individual block. The physical time delay may relate to an idling time and/or an actual time for executing the algorithm of the individual block. For example, the physical time delay characteristics may be expressed as a fastest execution time of the individual block, the slowest execution time of the individual block, a worst case execution time of the individual block, an average execution time of the individual block, and/or in another manner. The physical time delay characteristics may further relate to an execution time as measured in a particular environment, such as on a particular type of processor, a particular emulator, a particular FPGA, in a Hardware Description Level (HDL) model simulator, etc. In some implementations, TCE 215 may obtain the physical time delay characteristics, for an individual block, on a per step basis, a per output process basis, and/or a per update process basis.

In some implementations, TCE 215 may identify characteristics relating to a logical time delay associated with each individual block. The logical time delay may correspond to the latency between an input port of the individual block and an output port of the individual block. In some implementations, TCE 215 may identify the logical time delay based on the quantity of computational calls or algorithm executions that are needed for the individual block to produce an output value based on one or more input values. In some implementations, TCE 215 may obtain the logical time delay characteristics, for an individual block, on a per output process basis and/or a per update process basis. Other manners of identifying the logical time delay may alternatively be used.

TCE 215 may determine whether sorted order 740 results in Data Store Write block 710 writing data to Data Store Memory block 705 prior to Data Store Read block 715 accessing Data Store Memory block 705 based on characteristics relating to a physical time delay associated with each individual block. For example, TCE 215 may determine whether sorted order 740 results in Data Store Write block 710 writing data to Data Store Memory block 705 prior to Data Store Read block 715 accessing Data Store Memory block 705 based on the physical time delay and/or the logical time delay associated with each individual block.

Referring now to FIG. 7G, to perform the physical time analysis of the model, TCE 215 may generate a modified version of the model. As shown in FIG. 7G, TCE 215 replaces the Gain block, the Gain1 block, the Product block, and the Add block with Delay blocks ("Unit Delay," Unit Delay1," "Unit Delay2," and "Unit Delay 3") that represent the physical time required for each block to execute. TCE 215 also adds Step blocks ("Step block," "Step1 block," and "Step2 block"). During execution of the modified model, the Step blocks provide pulses. TCE 215 determines when, in physical time, each computation starts and ends based on the pulses provided by the Step blocks. Based on determining when each computation starts and ends, TCE 215 determines whether sorted order 725 results in the Data Store Write block writing data to the Data Store Memory block prior to the Data Store Read block accessing Data Store Memory Block.

Figure 7I:
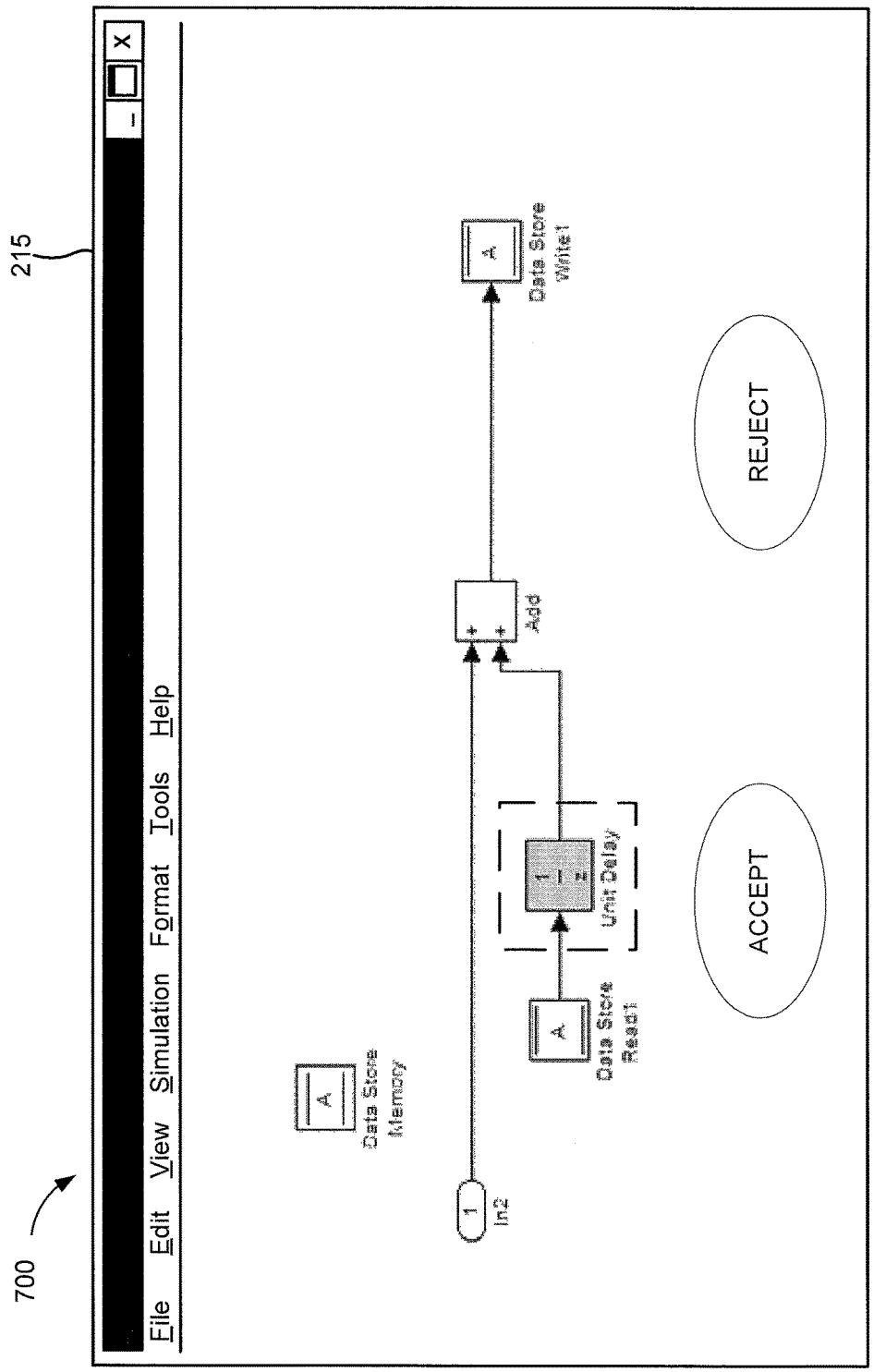

Referring to FIGS. 7H and 7I, assume that, based on the modified model, TCE 215 determines that sorted order 725 does not result in the Data Store Write block writing data to the Data Store Memory block prior to the Data Store Read block accessing Data Store Memory Block. To cause the Data Store Write block to write the data to the Data Store Memory block prior to the Data Store Read block accessing the Data Store Memory block, TCE 215 may modify the model by inserting a delay block into the model. As shown in FIG. 7H, TCE 215 outputs, via graphical window 730, a result indicating that the Data Store Write block does not write data to the Data Store Memory block prior to the Data Store Read block accessing the Data Store Memory block to read data and provides an option that allows the user to view suggested modifications that can be made to the model to correct the issue.

As shown in FIG. 7I, in response to the user clicking the button, TCE 215 causes a modified version of a portion of the model to be displayed. The modified version of the portion of the model includes a dashed box displayed around the suggested modification ("Unit Delay" block) to enable the user to easily identify the suggested modification. TCE 215 may provide the user with the ability to accept the modification. If the user accepts the modification, TCE 215 may incorporate the modification into the model.

The foregoing description provides illustration and description, but is not intended to be exhaustive or to limit the implementations to the precise form disclosed. Modifications and variations are possible in light of the above disclosure or may be acquired from practice of the implementations.

As used herein, the term component is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A non-transitory computer-readable medium storing instructions, the instructions comprising:
   one or more instructions that, when executed by one or more processors, cause the one or more processors to:
      receive, from a user, a selection of one of:
         a graphical representation of one of a first data store or a second data store included in a model,
            the model, when executed, simulating a behavior of a system, or
         a string of text that identifies a data store variable associated with the model,
      provide, based on the selection, a user interface for providing patterns information associated with the first data store or the second data store,
      receive, via the user interface, the patterns information associated with the first data store or the second data store,
         the patterns information including an identifier that indicates that the patterns information is to be associated with the first data store or the second data store,
         the patterns information identifying one or more elements included in the model, and
         the patterns information identifying patterns associated with the one or more elements accessing the first data store or the second data store during an execution of the model,
      analyze the model, based on the patterns information, to determine whether the model accesses the first data store or the second data store in compliance with the patterns, and
      output a result indicating whether the model accesses the first data store or the second data store in compliance with the patterns.

2. The non-transitory computer-readable medium of claim 1, where the instructions further comprise:
   one or more instructions that, when executed by the one or more processors, cause the one or more processors to:
      perform a logical time analysis of the model,
      determine that the one or more elements access the first data store or the second data store in compliance with the patterns based on the logical time analysis,
      perform a physical time analysis of the model to determine:
         one or more write times associated with data being written to the first data store or the second data store, and
         one or more read times associated with data being read from the first data store or the second data store, and
      determine, based on the one or more write times and the one or more read times, whether the one or more elements access the first data store or the second data store in compliance with the patterns.

3. The non-transitory computer-readable medium of claim 1, where the graphical representation of the one of the first data store or the second data store includes a block corresponding to the first data store or the second data store, and the instructions further comprise:
   one or more instructions that, when executed by the one or more processors, cause the one or more processors to:
      receive a selection of the block, and
      provide the user interface based on the selection of the block.

4. The non-transitory computer-readable medium of claim 1, where the patterns information comprises first pattern information,
   where the patterns comprise a first pattern,
   where the instructions further comprise:
      one or more instructions that, when executed by the one or more processors, cause the one or more processors to:
         determine that the first pattern information includes information indicating that the first pattern is to be associated with the first data store or the second data store, and
         determine that the patterns information includes second pattern information that identifies a second pattern that is to be associated with the first data store or the second data store,
            the second pattern being different from the first pattern,
         determine whether the one or more elements access the first data store or the second data store in compliance with the first pattern, and
         determine whether the one or more elements access the first data store or the second data store in compliance with the second pattern.

5. The non-transitory computer-readable medium of claim 1, where the patterns information includes constraint information that indicates one of:
that the patterns are required,
that the patterns are forbidden,
that the patterns are desirable, or
that the patterns are undesirable.

6. The non-transitory computer-readable medium of claim 1,
where the patterns comprise a first pattern associated with the one or more elements of the model accessing the first data store or the second data store during execution of the model,
where the patterns information identifies a second pattern associated with one or more other elements of the model accessing the first data store or the second data store during the execution of the model,
where the patterns information indicates a first level of priority associated with the first pattern and a second level of priority associated with the second pattern,
where the first level or priority is a higher level of priority relative to the second level of priority, and
where the one or more instructions further comprise:
one or more instructions that, when executed by the one or more processors, cause the one or more processors to:
determine that when the model is executed based on a first sorted order, the one or more elements access the first data store or the second data store in compliance with the first pattern and the one or more other elements do not access the first data store or the second data store in compliance with the second pattern,
determine that when the model is executed based on a second sorted order, the one or more other elements access first data store or the second data store in compliance with the second pattern and the one or more elements do not access the first data store or the second data store in compliance with the first pattern, and
cause, based on the first pattern being associated with the first level of priority, the model to execute based on the first sorted order.

7. The non-transitory computer-readable medium of claim 1, where the patterns information includes temporal information that defines the patterns.

8. The non-transitory computer-readable medium of claim 1, where the instructions further comprise:
one or more instructions that, when executed by the one or more processors, cause the one or more processors to:
simulate an execution of the model to determine one or more logical times associated with the one or more elements accessing the first data store or the second data store, and
determine whether the one or more elements access the first data store or the second data store in compliance with the patterns based on the one or more logical times.

9. A device comprising:
one or more processors to:
receive a model,
the model, when executed, simulating a behavior of a system,
the model including a first data store and a second data store,
the first data store being associated with first pattern information,
the first pattern information indicating that a first portion of the model is to access the first data store according to a first pattern, and
the second data store being associated with second pattern information, the second pattern information indicating that a second portion of the model is to access the second data store according to a second pattern, and
the second pattern being different from the first pattern;
analyze the model based on the first pattern information and the second pattern information; and
output a result indicating:
whether the first portion of the model accesses the first data store in compliance with the first pattern, and
whether the second portion of the model accesses the second data store in compliance with the second pattern.

10. The device of claim 9, where the one or more processors are further to:
perform a physical time analysis of the model to determine:
one or more write times associated with data being written to the first data store and data being written to the second data store, and
one or more read times associated with data being read from the first data store and the second data store, and
determine, based on the one or more write times and the one or more read times, whether a sorted order can be computed,
where, during an execution of the model based on the sorted order, the first portion of the model accesses the first data store in compliance with the first pattern and the second portion of the model accesses the second data store in compliance with the second pattern based on the one or more write times and the one or more read times.

11. The device of claim 9, where the one or more processors are further to:
cause a graphical representation of the model to be displayed via a technical computing environment;
receive, via the technical computing environment, a request to provide pattern information;
provide, via the technical computing environment, a user interface for providing the pattern information based on the request; and
receive, via the user interface, the first pattern information and the second pattern information.

12. The device of claim 9, where a third portion of the model accesses the first data store during an execution of the model, and
where the one or more processors are further to:
determine, based on the first pattern information, not to analyze the third portion of the model with respect to the first pattern.

13. The device of claim 9, where the one or more processors are further to:
determine, based on the first pattern information and the second pattern information, a set of constraints for a sorted order for the model, and
determine, based on the set of constraints, whether the sorted order can be computed, where, during an execution of the model based on the sorted order, the first portion of the model accesses the first data store in compliance with the first pattern and the second portion of the model accesses the second data store in compliance with the second pattern.

14. The device of claim 9, where the one or more processors are further to:
   determine, based on the first pattern information and the second pattern information, a set of constraints for a plurality of sorted orders for the model,
   determine, based on the set of constraints, whether each sorted order of the plurality of sorted orders can be computed such that the first portion of the model accesses the first data store in compliance with the first pattern and the second portion of the model accesses the second data store in compliance with the second pattern, and
   determine that the first portion of the model accesses the first data store in compliance with the first pattern and that the second portion of the model access the second data store in compliance with the second pattern when each sorted order of the plurality of sorted orders can be computed such that the first portion of the model accesses the first data store in compliance with the first pattern and the second portion of the model accesses the second data store in compliance with the second pattern.

15. A method comprising:
   receiving a model,
      the model, when executed, simulating a behavior of a system,
      the model including a first data store and a second data store,
      the first data store being associated with first pattern information,
         the first pattern information indicating that a first portion of the model is to access the first data store according to a first pattern,
      the second data store being associated with second pattern information,
         the second pattern information indicating that a second portion of the model is to access the second data store according to a second pattern, and
      the second pattern being different from the first pattern, and
      the receiving the model being performed by a device;
   analyzing the model based on the first pattern information and the second pattern information,
      the analyzing the model being performed by the device; and
   outputting a result,
      the outputting the result being performed by the device, and
      the result indicating:
         whether the first portion of the model accesses the first data store in compliance with the first pattern, and
         whether the second portion of the model accesses the second data store in compliance with the second pattern.

16. The method of claim 15, the method further comprising:
   performing a physical time analysis of the model, and
   determining, based on the physical time analysis, whether a sorted order can be computed for the model,
   where, during an execution of the model based on the sorted order, the first portion of the model accesses the first data store in compliance with the first pattern and the second portion of the model accesses the second data store in compliance with the second pattern based on the physical time analysis.

17. The method of claim 15, the method further comprising:
   receiving a request to provide pattern information;
   providing a user interface for providing the pattern information based on the request; and
   receiving one or more of the first pattern information or the second pattern information via the user interface.

18. The method of claim 15, the method further comprising:
   receiving a selection of a graphical representation of the first data store;
   providing a user interface for providing the first pattern information based on the selection; and
   receiving the first pattern information via the user interface.

19. The method of claim 15, where a third portion of the model accesses the first data store and the second data store during the execution of the model, the method further comprising:
   determining, based on the first pattern information, not to analyze the third portion of the model with respect to the first pattern; and
   determining, based on the second pattern information, to analyze the third portion of the model with respect to the second pattern.

20. The method of claim 15, the method further comprising:
   determining, based on the first pattern information and the second pattern information, a set of constraints for a sorted order for the model;
   determining, based on the set of constraints, a first sorted order for the model and a second sorted order for the model,
      where the second sorted order is different from the first sorted order,
      where, during an execution of the model based on the first sorted order, the first portion of the model accesses the first data store in compliance with the first pattern and the second portion of the model accesses the second data store in compliance with the second pattern, and
      where, during an execution of the model based on the second sorted order, the first portion of the model does not access the first data store in compliance with the first pattern or the second portion of the model does not access the second data store in compliance with the second pattern;
   outputting information identifying the first sorted order and the second sorted order;
   outputting information indicating that, during the execution of the model based on the first sorted order, the first portion of the model accesses the first data store in compliance with the first pattern and the second portion of the model accesses the second data store in compliance with the second pattern;
   outputting information indicating that, during the execution of the model based on the second sorted order, the first portion of the model does not access the first data store in compliance with the first pattern or the second portion of the model does not access the second data store in compliance with the second pattern;

receiving a selection of the first sorted order; and
modifying the model based on the selection,
  modifying the model causing the model to be executed based on the first sorted order.

21. A non-transitory computer-readable medium storing instructions, the instructions comprising:
  one or more instructions that, when executed by one or more processors, cause the one or more processors to:
    receive, from a user, a selection of one of:
      a graphical representation of a first data store and a second data store included in a model,
        the model, when executed, simulating a behavior of a system, or
      a string of text that identifies a data store variable associated with the model,
    provide, based on the selection, a user interface for providing patterns information associated with the first data store and the second data store,
    receive, via the user interface, the patterns information associated with the first data store and the second data store,
      the patterns information identifying one or more elements included in the model, and
      the patterns information identifying patterns associated with the one or more elements accessing the first data store and the second data store during an execution of the model,
    analyze the model, based on the patterns information, to determine whether the one or more elements access the first data store or the second data store in compliance with the patterns, and
    output a result indicating whether the one or more elements access the first data store or the second data store in compliance with the patterns.

* * * * *